US012490599B2

(12) United States Patent
Han et al.

(10) Patent No.: US 12,490,599 B2
(45) Date of Patent: Dec. 2, 2025

(54) DISPLAY PANEL AND DISPLAY APPARATUS INCLUDING THE SAME

(71) Applicant: Samsung Display Co., Ltd., Yongin-si (KR)

(72) Inventors: Saehee Han, Yongin-si (KR); Gwuihyun Park, Yongin-si (KR); Chulwon Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 497 days.

(21) Appl. No.: 17/539,043

(22) Filed: Nov. 30, 2021

(65) Prior Publication Data

US 2022/0271256 A1   Aug. 25, 2022

(30) Foreign Application Priority Data

Feb. 23, 2021   (KR) ........................ 10-2021-0024362

(51) Int. Cl.
*H10K 59/123*   (2023.01)
*H10K 59/12*   (2023.01)
(Continued)

(52) U.S. Cl.
CPC ........... *H10K 59/123* (2023.02); *H10K 59/12* (2023.02); *H10K 59/1213* (2023.02);
(Continued)

(58) Field of Classification Search
CPC ....... H10K 50/00–88; H10K 59/00–95; H10K 2102/00–361; H10K 59/70; H10K 59/60;
(Continued)

(56) References Cited

U.S. PATENT DOCUMENTS 9,057,923 B2   6/2015   Chang et al.
10,847,593 B2   11/2020   Kim et al.
(Continued)

FOREIGN PATENT DOCUMENTS

CN   110444125 A   11/2019
CN   110504275 A   11/2019
(Continued)

*Primary Examiner* — Matthew C Landau
*Assistant Examiner* — Nora T. Nix
(74) *Attorney, Agent, or Firm* — Harness, Dickey & Pierce, P.L.C.

(57) ABSTRACT

A display panel includes a substrate including a main display area, a component area, and a peripheral area, an inorganic insulating layer disposed over the substrate and including an opening overlapping the component area, a first organic insulating layer filling the opening of the inorganic insulating layer, and an auxiliary display element disposed over the first organic insulating layer in the component area, wherein the inorganic insulating layer includes a first insulating layer having a first opening, a second insulating layer having a second opening, and a third insulating layer having a third opening the first opening of the first insulating layer, the second opening of the second insulating layer, and the third opening of the third insulating layer overlap each other in the opening of the inorganic insulating layer, and an area of the first opening is less than an area of the third opening.

20 Claims, 20 Drawing Sheets

(51) Int. Cl.
  *H10K 59/121* (2023.01)
  *H10K 59/131* (2023.01)
  *H10K 59/80* (2023.01)
  *H10K 59/65* (2023.01)

(52) U.S. Cl.
  CPC ......... *H10K 59/131* (2023.02); *H10K 59/873* (2023.02); *H10K 59/65* (2023.02)

(58) Field of Classification Search
  CPC ............. H10K 59/65; H10K 2102/311; H10K 77/111; B32B 2457/206
  See application file for complete search history.

(56) References Cited

U.S. PATENT DOCUMENTS

| | | | | |
|---|---|---|---|---|
| 2003/0116768 | A1* | 6/2003 | Ishikawa | H10D 30/6723 257/E27.113 |
| 2018/0053906 | A1* | 2/2018 | Lee | H10K 50/844 |
| 2018/0182838 | A1* | 6/2018 | Yeo | H10K 59/1315 |
| 2019/0044092 | A1* | 2/2019 | Park | H10K 59/122 |
| 2019/0212788 | A1* | 7/2019 | Kwak | H04N 23/45 |
| 2019/0259967 | A1* | 8/2019 | Yang | G06F 1/1652 |
| 2020/0251539 | A1* | 8/2020 | Fu | H10K 59/12 |
| 2022/0208907 | A1* | 6/2022 | Ryu | H10K 59/131 |
| 2022/0310743 | A1* | 9/2022 | Yi | H10K 59/123 |

FOREIGN PATENT DOCUMENTS

| | | |
|---|---|---|
| CN | 111028692 | 4/2020 |
| CN | 111063719 | 4/2020 |
| KR | 10-2012-0036186 | 4/2012 |
| KR | 10-2019-0084397 | 7/2019 |
| KR | 10-2020-0077477 | 6/2020 |
| KR | 10-2020-0115887 A | 10/2020 |
| KR | 10-2020-0131397 A | 11/2020 |
| KR | 10-2020-0145954 A | 12/2020 |

* cited by examiner

DISPLAY PANEL AND DISPLAY APPARATUS INCLUDING THE SAME

CROSS-REFERENCE TO RELATED APPLICATION

This application claims priority from and the benefit of Korean Patent Application No. 10-2021-0024362, filed on Feb. 23, 2021, which is hereby incorporated by reference for all purposes as if fully set forth herein.

BACKGROUND

Field

Embodiments of the invention relate generally to a display panel and a display apparatus including the display panel, and more particularly, to a display panel in which a display area is extended such that an image may be displayed even in an area where a component such as an electronic element is arranged, and a display apparatus including the display panel.

Discussion of the Background

Recently, display apparatuses have been used for various purposes. Also, as display apparatuses have become thinner and lighter, their range of use has widened.

As display apparatuses are used in various ways, various methods may be used to design the shapes of display apparatuses, and further, more and more functions may be combined or associated with display apparatuses.

The above information disclosed in this Background section is only for understanding of the background of the inventive concepts, and, therefore, it may contain information that does not constitute prior art.

SUMMARY

Applicants discovered that a display panel of a display device having a main display area, in which an image is mainly displayed, and a component area, in which a component as an electronic element is disposed and the image is auxiliary displayed, is implemented, connection lines in the component area of the display panel have defects due to the poor flatness of an organic insulation layer in the component area of the display panel.

Display devices constructed according to the principles of the invention are capable of preventing or minimizing the defects of the connection lines in the component area of the display panel of the display devices by providing inorganic insulating layers with openings having stair-shaped step differences between the main display area and the component area.

Additional features of the inventive concepts will be set forth in the description which follows, and in part will be apparent from the description, or may be learned by practice of the inventive concepts.

According to an aspect of the invention, a display panel includes a substrate including a main display area, a component area, and a peripheral area, an inorganic insulating layer disposed over the substrate and including an opening overlapping the component area, a first organic insulating layer filling the opening of the inorganic insulating layer, and an auxiliary display element disposed over the first organic insulating layer in the component area, wherein the inorganic insulating layer includes a first insulating layer having a first opening, a second insulating layer having a second opening, and a third insulating layer having a third opening the first opening of the first insulating layer, the second opening of the second insulating layer, and the third opening of the third insulating layer overlap each other in the opening of the inorganic insulating layer, and an area of the first opening is less than an area of the third opening.

The display panel may further include an auxiliary pixel circuit disposed in the peripheral area and including an auxiliary thin film transistor, and a transparent connection line connecting the auxiliary display element to the auxiliary pixel circuit and at least partially disposed over the first organic insulating layer of the component area.

Each of a first distance between an end of an inner surface of the first opening and an end of an inner surface of the second opening and a second distance between an end of an inner surface of the second opening and an end of an inner surface of the third opening may be about 2 μm or more, and a sum of the first distance and the second distance may be about 25 μm or less.

A sum of a thickness of the first insulating layer and a thickness of the second insulating layer may be about 3000 Å or less, and an inner surface of the first opening and an inner surface of the second opening are may be on a same plane.

The third insulating layer may include a stack of a first layer and a second layer formed of different materials, and wherein: the first layer may include a (3-1)th opening, the second layer may include a (3-2)th opening, and an inner surface of the (3-1)th opening and an inner surface of the (3-2)th opening may be misaligned with each other.

The display panel may further include a buffer layer disposed between the substrate and the inorganic insulating layer, wherein the buffer layer may be continuously disposed in the component area.

The display panel may further include a buffer layer disposed between the substrate and the inorganic insulating layer, wherein the buffer layer may include a buffer-opening in the component area.

The display panel may further include a metal connection line connecting the transparent connection line to the auxiliary display element, wherein the metal connection line and the transparent connection line may be disposed on a same layer, and an end of the transparent connection line may directly contact the metal connection line.

The display panel may further include a main display element disposed in the main display area and a main pixel circuit connected to the main display element, wherein the first organic insulating layer may be disposed between the main display element and the main pixel circuit.

The display panel may further include a second organic insulating layer disposed over the first organic insulating layer.

According to another aspect of the invention, a display apparatus includes a display panel including a main display area including main subpixels, a component area including auxiliary subpixels, and a peripheral area, and a component disposed under the display panel to correspond to the component area, the display panel including a substrate, an inorganic insulating layer disposed over the substrate and including an opening overlapping the component area, a first organic insulating layer filling the opening of the inorganic insulating layer, and an auxiliary display element disposed over the first organic insulating layer in the component area, wherein: the inorganic insulating layer comprises a first insulating layer having a first opening, a second insulating layer having a second opening, and a third insulating layer having a third opening, the first opening of the first insulating layer, the second opening of the second insulating layer, and the third opening of the third insulating layer overlap each other in the opening of the inorganic insulating layer, and an area of the first opening is less than an area of the third opening.

The display apparatus may further include an auxiliary pixel circuit disposed in the peripheral area and including an auxiliary thin film transistor, and a transparent connection line connecting the auxiliary display element to the auxiliary pixel circuit and at least partially disposed over the first organic insulating layer of the component area.

Each of a first distance between an end of an inner surface of the first opening and an end of an inner surface of the second opening and a second distance between an end of an inner surface of the second opening and an end of an inner surface of the third opening may be about 2 μm or more, and a sum of the first distance and the second distance may be about 25 μm or less.

A sum of a thickness of the first insulating layer and a thickness of the second insulating layer may be about 3000 Å or less, and an inner surface of the first opening and an inner surface of the second opening may be on a same plane as an inner surface of the second opening.

The third insulating layer may include a stack of a first layer and a second layer formed of different materials, the first layer may include a (3-1)th opening, the second layer may include a (3-2)th opening, and an inner surface of the (3-1)th opening and an inner surface of the (3-2)th opening may be misaligned with each other.

The display apparatus may further include a buffer layer disposed between the substrate and the inorganic insulating layer, wherein the buffer layer may be continuously disposed in the component area.

The display apparatus may further include a buffer layer disposed between the substrate and the inorganic insulating layer, wherein the buffer layer may include a buffer-opening in the component area.

The display apparatus may further include a metal connection line connecting the transparent connection line to the auxiliary display element, wherein the metal connection line and the transparent connection line may be disposed on a same layer, and an end of the transparent connection line may directly contact the metal connection line.

The display apparatus may further include a main display element disposed in the main display area and a main pixel circuit connected to the main display element, wherein the first organic insulating layer may be disposed between the main display element and the main pixel circuit.

The component may include an imaging device.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
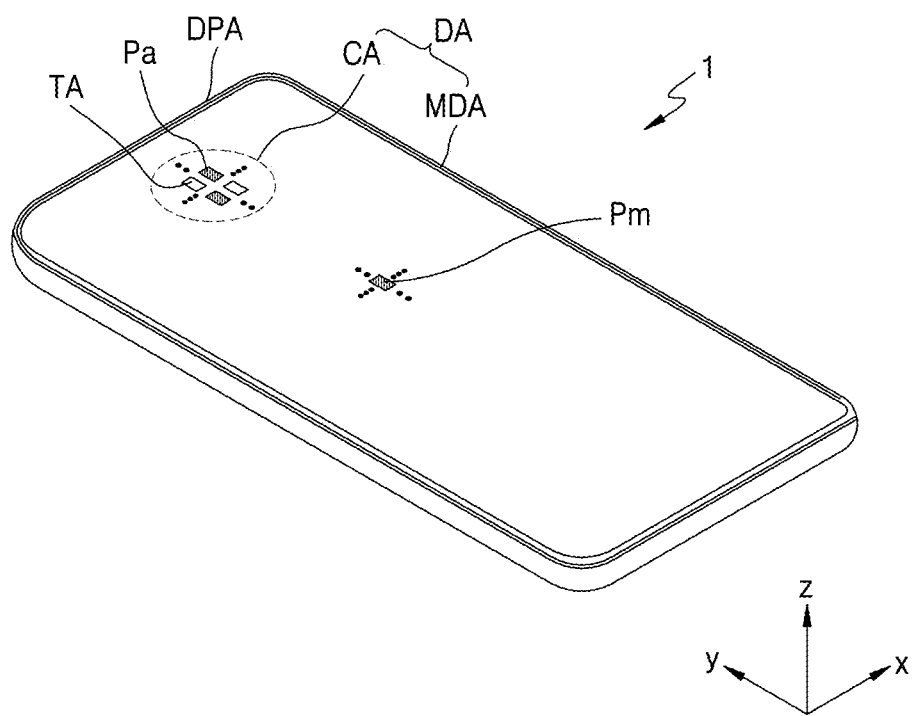
FIG. 1 is a perspective view of a display apparatus constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view schematically illustrating a display apparatus 1 according to an embodiment.

Referring to FIG. 1, the display apparatus 1 may include a display area DA and a peripheral area DPA outside the display area DA. The display area DA may include a component area CA and a main display area MDA at least partially surrounding the component area CA. For example, each of the component area CA and the main display area MDA may display an image independently or cooperatively. The peripheral area DPA may be a type of non-display area in which display elements are not arranged. The display area DA may be partially or entirely surrounded by the peripheral area DPA.

FIG. 1 illustrates that one component area CA is located inside the main display area MDA. In other embodiments, the display apparatus 1 may include two or more component areas CA and the shapes and sizes of component areas CA may be different from each other. In a view in a direction substantially perpendicular to the upper surface of the display apparatus 1, the component area CA may have various shapes such as circular shapes, elliptical shapes, polygonal shapes such as tetragonal shapes, star shapes, or diamond shapes. Also, FIG. 1 illustrates that the component area CA is arranged at the upper center (in the positive y direction) of the main display area MDA having a substantially rectangular shape in a view in a direction substantially perpendicular to the upper surface of the display apparatus 1. However, the component area CA may be arranged at one side of the main display area MDA having a rectangular shape, for example, at the upper right side or the upper left side thereof.

The display apparatus 1 may display an image by using a plurality of main subpixels Pm arranged in the main display area MDA and a plurality of auxiliary subpixels Pa arranged in the component area CA.

As described below with reference to FIG. 2A, in the component area CA, a component 40 as an electronic element may be arranged under a display panel corresponding to the component area CA. The component 40 may include an imaging device as a camera using infrared light or visible light. Alternatively, the component 40 may include a solar cell, a flash, an illuminance sensor, a proximity sensor, or an iris sensor. Alternatively, the component 40 may have a function of receiving sound. In order to minimize the limitation of the function of the component 40, the component area CA may include a transmission area TA that may transmit light and/or sound output from the component 40 to the outside or propagating toward the component 40 from the outside. In the case of a display panel and a display apparatus including the display panel according to an embodiment, when light is transmitted through the component area CA, the light transmittance thereof may be about 10% or more, for example, about 40% or more, about 25% or more, about 50% or more, about 85% or more, or about 90% or more.

A plurality of auxiliary subpixels Pa may be arranged in the component area CA. The plurality of auxiliary subpixels Pa may provide a certain image by emitting light. The image displayed in the component area CA may be an auxiliary image and may have a lower resolution than the image displayed in the main display area MDA. For example, when the component area CA includes a transmission area TA through which light and sound may be transmitted and no subpixel is arranged over the transmission area TA, the number of auxiliary subpixels Pa that may be arranged per unit area therein may be less than the number of main subpixels Pm arranged per unit area in the main display area MDA.

FIGS. 2A, 2B, 2C, and 2D are cross-sectional views schematically illustrating a portion of a cross-section of a display apparatus 1 according to embodiments.

Figure 2A:
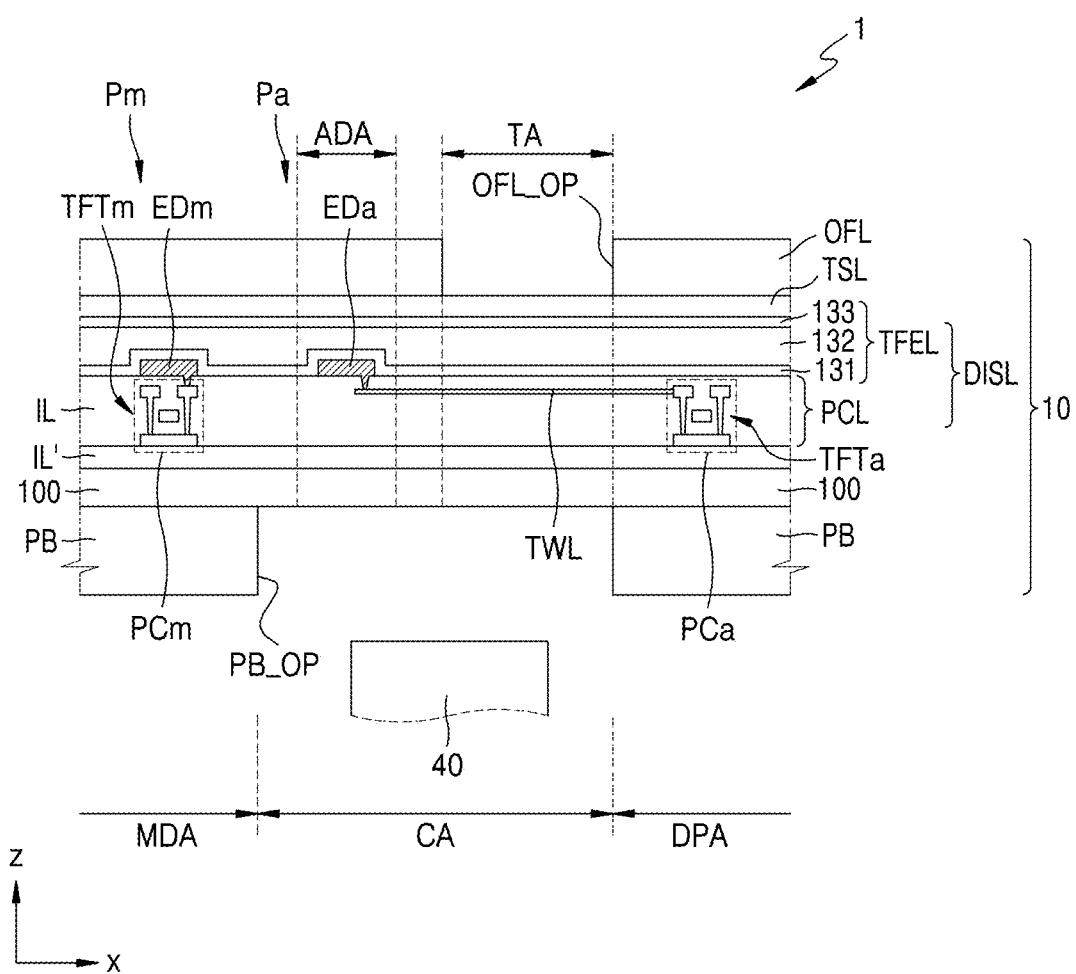
FIG. 2A is a cross-sectional view of a portion of an embodiment of the display apparatus of FIG. 1.
Figure 2B:
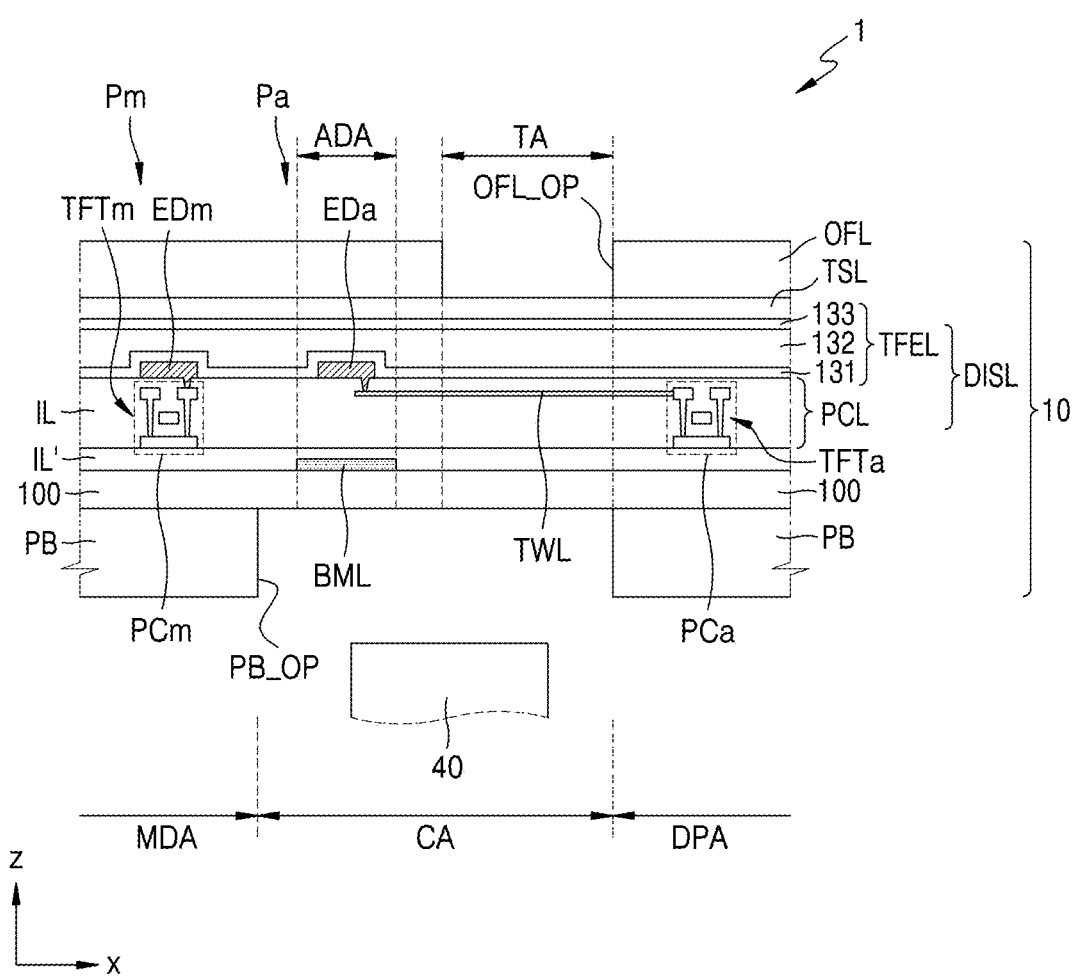
FIG. 2B is a cross-sectional view schematically illustrating a portion of another embodiment of the display apparatus of FIG. 1.

Referring to FIG. 2A, the display apparatus 1 may include a display panel 10 and a component 40 arranged to overlap the display panel 10. A cover window for protecting the display panel 10 may be further arranged over the display panel 10.

The display panel 10 may include a component area CA overlapping the component 40 and a main display area MDA in which a main image is displayed. The display panel 10 may include a substrate 100, a display layer DISL over the substrate 100, a touch screen layer TSL, an optical functional layer OFL, and a panel protection member PB arranged under the substrate 100.

The display layer DISL may include a circuit layer PCL including thin film transistors TFTm and TFTa, a display element layer including light emitting elements EDm and EDa as display elements, and a thin film encapsulation layer TFEL. Insulating layers IL and IL' may be arranged in the display layer DISL and between the substrate 100 and the display layer DISL.

The substrate 100 may include an insulating material such as glass, quartz, or polymer resin. The substrate 100 may include a rigid substrate or a flexible substrate capable of bending, folding, rolling, or the like.

A main pixel circuit PCm and a main light emitting element EDm connected thereto may be arranged in the main display area MDA of the display panel 10. The main pixel circuit PCm may include at least one thin film transistor TFTm and may control light emission of the main light emitting element EDm. A main subpixel Pm may be implemented by light emission of the main light emitting element EDm.

An auxiliary light emitting element EDa may be arranged in the component area CA of the display panel 10 to implement an auxiliary subpixel Pa. In an embodiment, an auxiliary pixel circuit PCa for driving the auxiliary light emitting element EDa may not be arranged in the component area CA but may be arranged in a peripheral area DPA, e.g., in a non-display area. In various other embodiments, the auxiliary pixel circuit PCa may be arranged in a portion of the main display area MDA or may be arranged between the main display area MDA and the component area CA. For example, the auxiliary pixel circuit PCa may be arranged not to overlap the auxiliary light emitting element EDa.

The auxiliary pixel circuit PCa may include at least one thin film transistor TFTa and may be electrically connected to the auxiliary light emitting element EDa through a transparent connection line TWL. The transparent connection line TWL may include a transparent conductive material. The auxiliary pixel circuit PCa may control light emission of the auxiliary light emitting element EDa. The auxiliary subpixel Pa may be implemented by light emission of the auxiliary light emitting element EDa. An area of the component area CA in which the auxiliary light emitting element Eda is arranged may be referred to as an auxiliary display area ADA.

Also, an area of the component area CA in which the auxiliary light emitting element EDa as a display element is not arranged may be referred to as a transmission area TA. For example, the transmission area TA may be the remaining area of the component area CA in which the auxiliary light emitting element EDa is not arranged. The transmission area TA may be an area through which the light/signal output from the component 40 or the light/signal input to the component 40 arranged corresponding to the component area CA is transmitted. The transparent connection line TWL connecting the auxiliary pixel circuit PCa to the auxiliary light emitting element EDa may be arranged in the transmission area TA. Because the transparent connection line TWL may include a transparent conductive material having high transmittance, the transmission area TA may have a high transmittance even when the transparent connection line TWL is arranged in the transmission area TA.

In an embodiment, because the auxiliary pixel circuit PCa is not arranged in the component area CA, the area of the transmission area TA may be expanded and thus the light transmittance thereof may be further improved.

The main light emitting element EDm and the auxiliary light emitting element EDa, which are display elements, may be covered by a thin film encapsulation layer TFEL or may be covered by an encapsulation substrate. In some embodiments, the thin film encapsulation layer TFEL may include at least one inorganic encapsulation layer and at least one organic encapsulation layer as illustrated in FIG. 2A. In an embodiment, the thin film encapsulation layer TFEL may include first and second inorganic encapsulation layers 131 and 133 and an organic encapsulation layer 132 therebetween.

The first inorganic encapsulation layer 131 and the second inorganic encapsulation layer 133 may include one or more inorganic insulating materials such as silicon oxide ($SiO_2$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide ($ZnO_2$) and may be formed by chemical vapor deposition (CVD) or the like. The organic encapsulation layer 132 may include a polymer-based material. The polymer-based material may include silicon-based resin, acryl-based resin, epoxy-based resin, polyimide, polyethylene, or the like.

The first inorganic encapsulation layer 131, the organic encapsulation layer 132, and the second inorganic encapsulation layer 133 may be integrally formed to cover the main display area MDA and the component area CA.

The main light emitting element EDm and the auxiliary light emitting element EDa, which are display elements, may be encapsulated by an encapsulation substrate instead of a thin film encapsulation layer TFEL. In this case, the encapsulation substrate may be arranged to face the substrate 100 with the display element therebetween. A gap may be between the encapsulation substrate and the display element. The encapsulation substrate may include glass. A sealant including frit or the like may be arranged between the substrate 100 and the encapsulation substrate, and the sealant may be arranged in the peripheral area DPA described above. The sealant arranged in the peripheral area DPA may surround the display area DA to prevent moisture from penetrating or permeating through the side surface thereof.

The touch screen layer TSL may be configured to obtain coordinate information according to an external input, for example, a touch event. The touch screen layer TSL may include a touch electrode and touch lines connected to the touch electrode. The touch screen layer TSL may sense an external input by using a self capacitance method or a mutual capacitance method.

The touch screen layer TSL may be formed over the thin film encapsulation layer TFEL. Alternatively, the touch screen layer TSL may be separately formed over a touch substrate and then coupled onto the thin film encapsulation layer TFEL through an adhesive layer such as an optical clear adhesive (OCA). In an embodiment, the touch screen layer TSL may be formed directly on the thin film encapsulation layer TFEL, and in this case, an adhesive layer may not be between the touch screen layer TSL and the thin film encapsulation layer TFEL.

The optical functional layer OFL may include an anti-reflection layer. The anti-reflection layer may be configured to reduce the reflectance of light (e.g., external light) incident from the outside toward the display apparatus 1.

In some embodiments, the optical functional layer OFL may include a polarization film. The optical functional layer OFL may include an opening OFL OP corresponding to the transmission area TA. Accordingly, the light transmittance of the transmission area TA may be significantly improved. The opening OFL OP may be filled with a transparent material such as optically clear resin (OCR).

In some embodiments, the optical functional layer OFL may be provided as a filter plate including a black matrix and color filters.

The panel protection member PB may be attached under the substrate 100 to support and protect the substrate 100. The panel protection member PB may include an opening PB_OP corresponding to the component area CA. Because the panel protection member PB includes the opening PB_OP, the light transmittance of the component area CA may be improved. The panel protection member PB may include polyethylene terephthalate (PET) or polyimide (PI).

The area of the component area CA may be greater than the area where the component 40 is arranged. Accordingly, the area of the opening PB_OP in the panel protection member PB may not match the area of the component area CA. For example, the outer line of the opening PB_OP in the panel protection member PB may not be aligned to the outer line of the component area CA.

Also, a plurality of components 40 may be arranged in the component area CA. The plurality of components 40 may have different functions. For example, the plurality of components 40 may include at least two of a camera (e.g., imaging device), a solar cell, a flash, a proximity sensor, an illuminance sensor, and an iris sensor.

In FIG. 2A, a bottom metal layer BML is not arranged under the auxiliary light emitting element EDa of the component area CA. However, in FIG. 2B, the display apparatus 1 according to an embodiment may include a bottom metal layer BML.

The bottom metal layer BML may be arranged between the substrate 100 and the auxiliary light emitting element EDa to overlap the auxiliary light emitting element EDa. The bottom metal layer BML may block the external light from reaching the auxiliary light emitting element EDa. Moreover, the bottom metal layer BML may be formed to correspond to the entire component area CA and may be provided to include a lower hole corresponding to the transmission area TA. In this case, the lower hole may be provided in various shapes such as polygonal, circular, or atypical shapes to control the diffraction characteristics of external light.

Figure 2C:
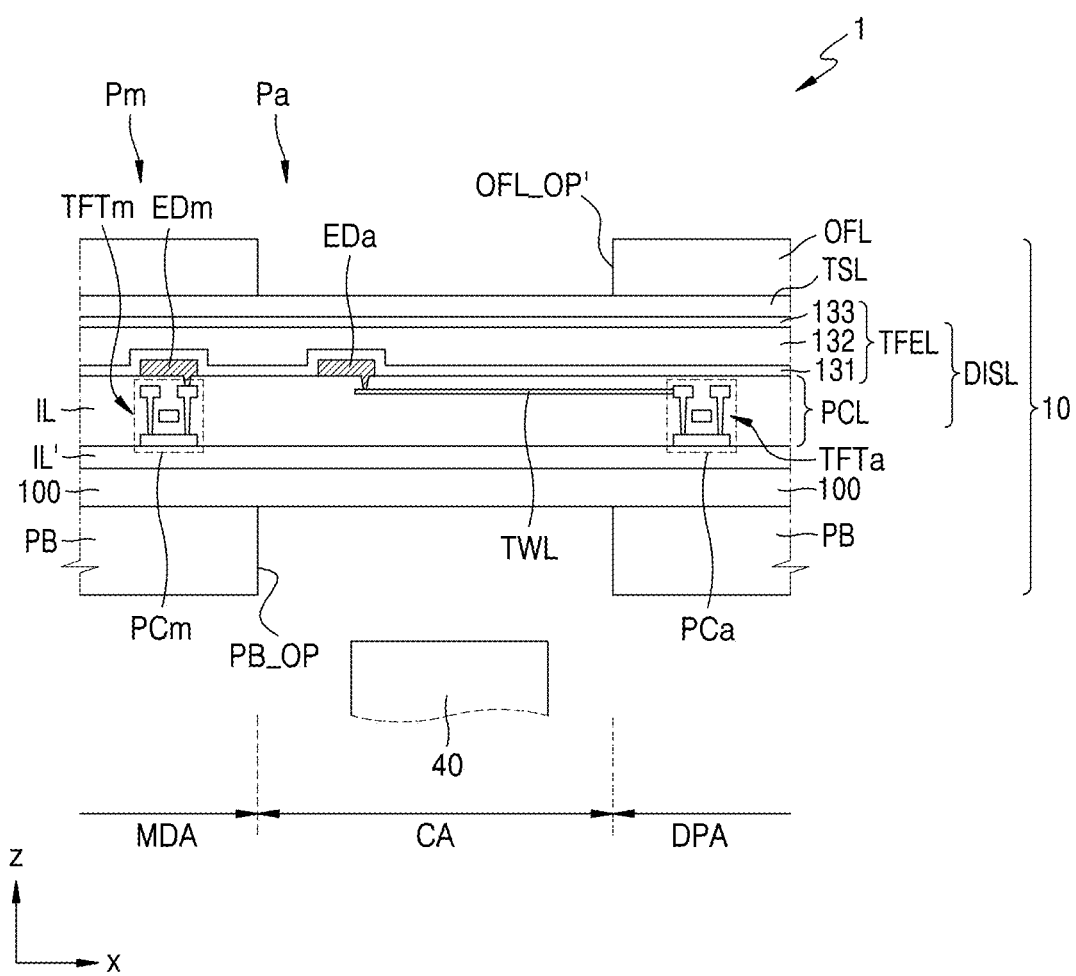
FIG. 2C is a cross-sectional view schematically illustrating a portion of another embodiment of the display apparatus of FIG. 1.

Also, although FIG. 2A illustrates that the optical functional layer OFL includes the opening OFL OP corresponding to the transmission area TA, the opening of the optical functional layer OFL may include an opening OFL OP' corresponding to the component area CA as illustrated in FIG. 2C. The opening OFL OP' may be filled with a transparent material such as optically clear resin (OCR).

Figure 2D:
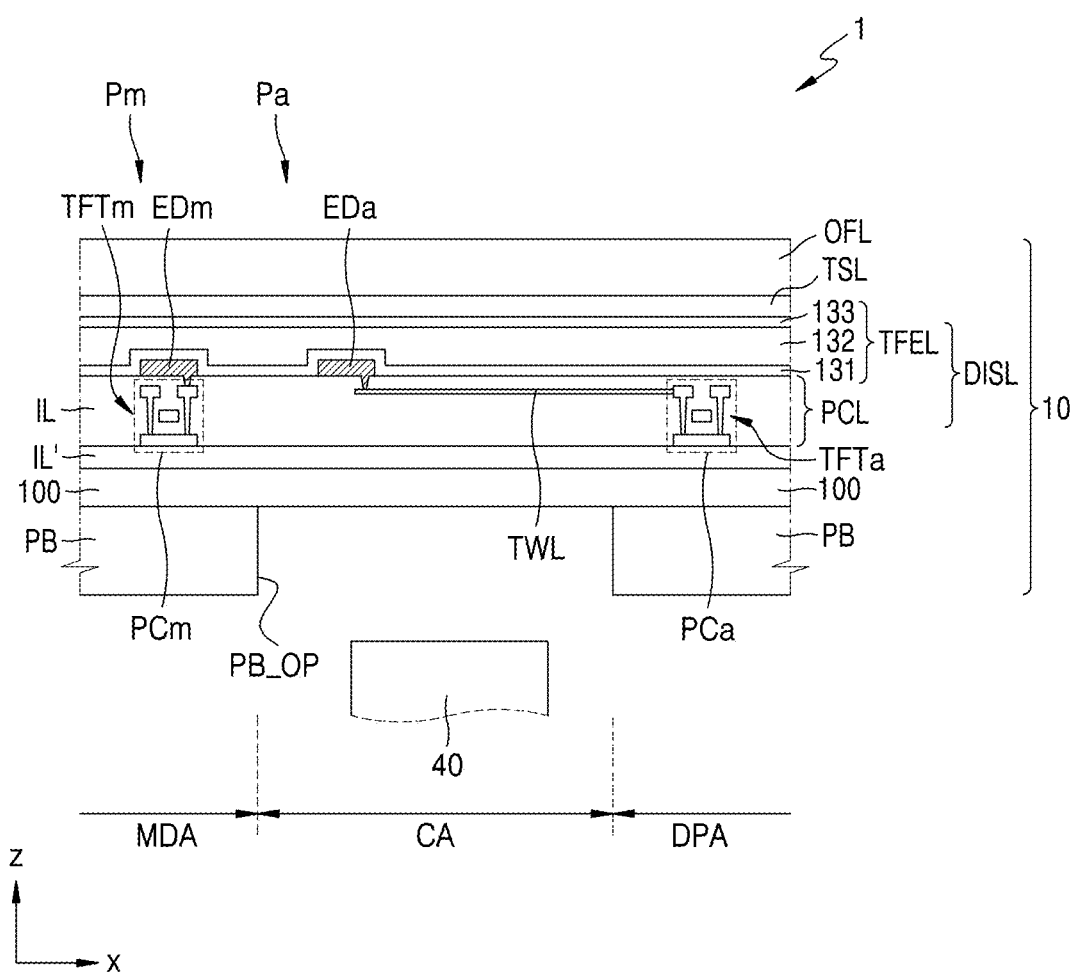
FIG. 2D is a cross-sectional view schematically illustrating a portion of another embodiment of the display apparatus of FIG. 1.

In other embodiments, as illustrated in FIG. 2D, the optical functional layer OFL may not include an opening, and a body of the optical functional layer OFL may be continuously arranged throughout the component area CA. For example, the optical functional layer OFL may entirely cover the component area CA.

Figure 3A:
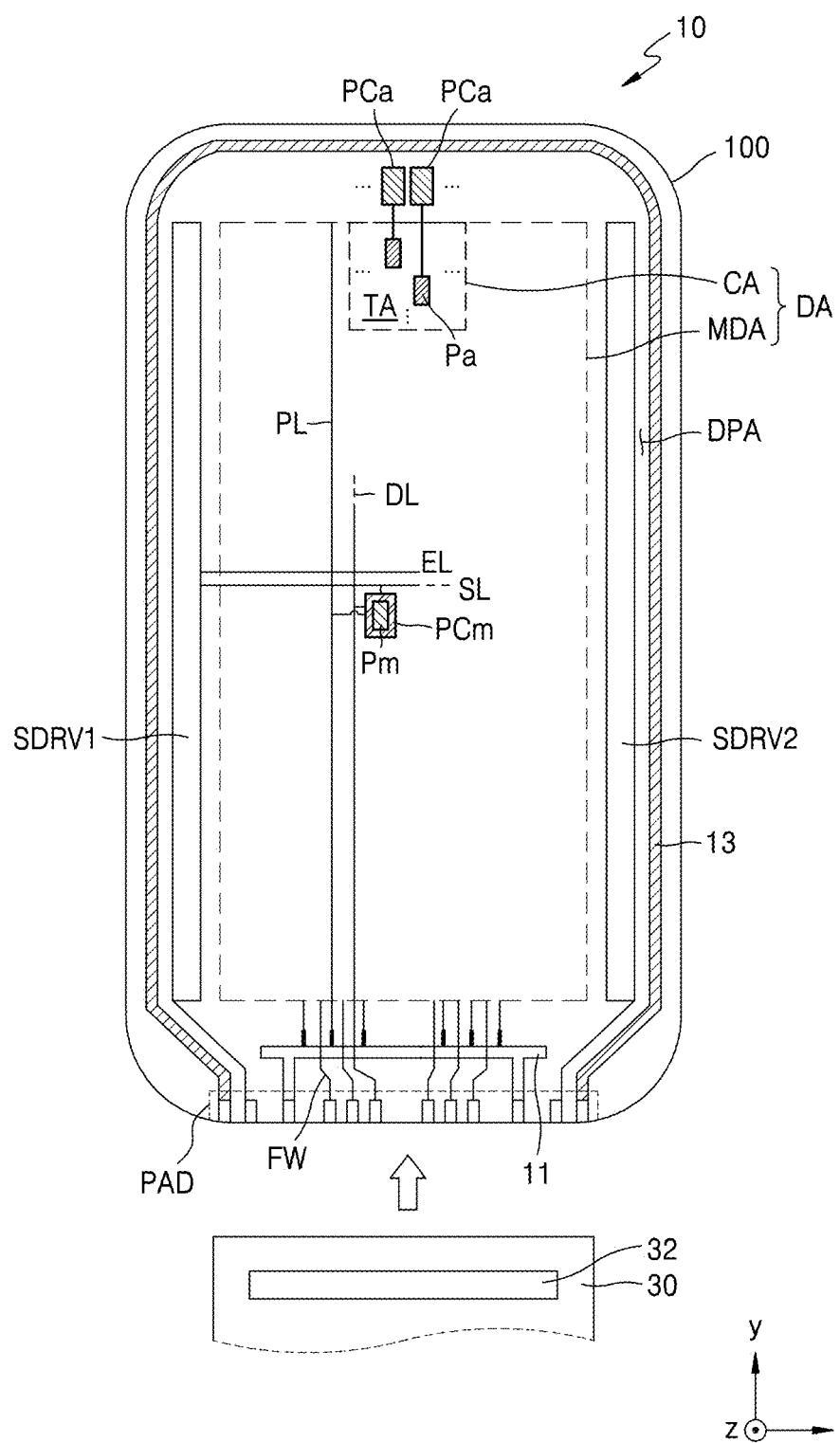
FIGS. 3A and 3B are plan views schematically illustrating embodiments of a display panel in the display apparatus of FIG. 1.
Figure 3B:
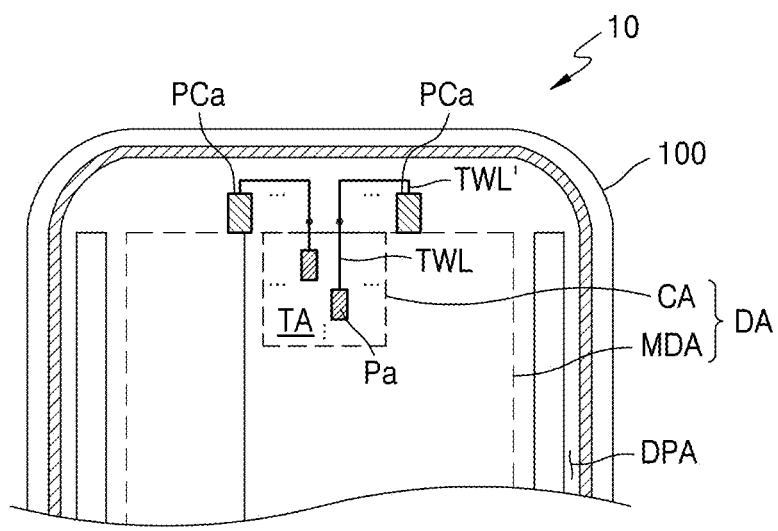

FIGS. 3A and 3B are plan views schematically illustrating a display panel that may be included in the display apparatus of FIG. 1.

Referring to FIG. 3A, various elements constituting a display panel 10 may be arranged over a substrate 100. The substrate 100 may include a display area DA and a peripheral area DPA surrounding the display area DA. The display area DA may include a main display area MDA in which a main image is displayed, and a component area CA which includes a transmission area TA and in which an auxiliary image is displayed. The auxiliary image may form an entire image together with the main image, and the auxiliary image may be an image independent from the main image.

A plurality of main subpixels Pm may be arranged in the main display area MDA. Each of the main subpixels Pm may be implemented by a display element such as an organic light emitting diode OLED. A main pixel circuit PCm for driving the main subpixel Pm may be arranged in the main display area MDA, and the main pixel circuit PCm may be arranged to overlap the main subpixel Pm. Each main subpixel Pm may emit, for example, red, green, blue, or white light. The main display area MDA may be covered by an encapsulation member to be protected from external air or moisture.

The component area CA may be at one side of the main display area MDA as described above or may be arranged inside the display area DA and surrounded by the main display area MDA. A plurality of auxiliary subpixels Pa may be arranged in the component area CA. Each of the plurality of auxiliary subpixels Pa may be implemented by a display element such as an organic light emitting diode. An auxiliary pixel circuit PCa for driving the auxiliary subpixel Pa may be arranged in the peripheral area DPA close to the component area CA. For example, when the component area CA is arranged over the display area DA, the auxiliary pixel circuit PCa may be arranged over the peripheral area DPA. The auxiliary pixel circuit PCa and the display element implementing the auxiliary subpixel Pa may be connected by a transparent connection line TWL extending in the y direction.

Each auxiliary subpixel Pa may emit, for example, red, green, blue, or white light. The component area CA may be covered by an encapsulation member to be protected from external air or moisture.

Moreover, the component area CA may include a transmission area TA. The transmission area TA may be arranged to surround a plurality of auxiliary subpixels Pa. Alternatively, the transmission area TA may be arranged in a grid form with a plurality of auxiliary subpixels Pa.

Because the component area CA includes a transmission area TA, the resolution of the component area CA may be lower than the resolution of the main display area MDA. For example, the resolution of the component area CA may be about $\frac{1}{2}$, $\frac{3}{8}$, $\frac{1}{3}$, $\frac{1}{4}$, $\frac{2}{9}$, $\frac{1}{8}$, $\frac{1}{9}$, or $\frac{1}{16}$ of the resolution of the main display area MDA. For example, the resolution of the main display area MDA may be about 400 ppi or more, and the resolution of the component area CA may be about 200 ppi or about 100 ppi.

Each of the pixel circuits (e.g., the main pixel circuit PCm and the auxiliary pixel circuit PCa) for driving the main subpixel Pm and the auxiliary subpixel Pa may be electrically connected to the peripheral circuits arranged in the peripheral area DPA. A first scan driving circuit SDRV1, a second scan driving circuit SDRV2, a terminal portion PAD, a driving voltage supply line 11, and a common voltage supply line 13 may be arranged in the peripheral area DPA.

The first scan driving circuit SDRV1 may apply a scan signal to each of the main pixel circuits PCm for driving the main subpixels Pm, through a main scan line SLm. The first scan driving circuit SDRV1 may apply an emission control signal to each pixel circuit through a main emission control line EL. The second scan driving circuit SDRV2 may be on the opposite side of the first scan driving circuit SDRV1 with respect to the main display area MDA and may be substantially parallel to the first scan driving circuit SDRV1. Some of the main pixel circuits PCm of the main subpixels Pm of the main display area MDA may be electrically connected to the first scan driving circuit SDRV1, and the others of the main pixel circuits PCm may be electrically connected to the second scan driving circuit SDRV2.

The terminal portion PAD may be arranged at one side of the substrate 100. The terminal portion PAD may be exposed by not being covered by an insulating layer, to be connected to a display circuit board 30. A display driver 32 may be arranged at the display circuit board 30.

The display driver 32 may generate a control signal to be transmitted to the first scan driving circuit SDRV1 and the second scan driving circuit SDRV2. The display driver 32 may generate a data signal, and the generated data signal may be transmitted to the main pixel circuits PCm through a fanout line FW and a main data line DL connected to the fanout line FW.

The display driver 32 may supply a driving voltage ELVDD to the driving voltage supply line 11 and may supply a common voltage ELVSS to the common voltage supply line 13. The driving voltage ELVDD may be applied to the pixel circuits of the main subpixel Pm and the auxiliary subpixel Pa through a driving voltage line PL connected to the driving voltage supply line 11, and the common voltage ELVSS may be connected to the common voltage supply line 13 to be applied to an opposite electrode of the display element.

The driving voltage supply line 11 may be provided to extend in the x direction under the main display area MDA. The common voltage supply line 13 may have a shape in which one side is open in a loop shape, to partially surround the main display area MDA.

Although FIG. 3A illustrates a case where there is one component area CA, the component area CA may be provided as a plurality of component areas CA. In this case, a plurality of component areas CA may be arranged to be apart from each other, a first camera may be arranged corresponding to a component area CA, and a second camera may be arranged corresponding to another component area CA. Alternatively, a camera may be disposed in a component area CA, and an infrared sensor may be disposed in another component area CA. The shapes and sizes of the plurality of component areas CA may be different from each other.

Moreover, the component area CA may have a circular, elliptical, polygonal, or atypical shape. In some embodiments, the component area CA may have an octagonal shape. The component area CA may have any polygonal shape such as a tetragonal shape or a hexagonal shape. The component area CA may be surrounded by the main display area MDA.

Also, in FIG. 3A, the auxiliary pixel circuit PCa is arranged to be adjacent to the outer side of the component area CA. However, embodiments are not limited thereto. As illustrated in FIG. 3B, the auxiliary pixel circuit PCa may be arranged to be adjacent to the outer side of the main display area MDA. In some embodiments, the transparent connection line TWL may be connected to the auxiliary pixel circuit PCa through a metal connection line TWL'. In this case, the transparent connection line TWL may be arranged in the component area CA, and the metal connection line TWL' may be arranged in the peripheral area DPA. The transparent connection line TWL may include a transparent conductive material, and the metal connection line TWL' may include a metal having high conductivity. In some embodiments, the metal connection line TWL' and the transparent connection line TWL may be disposed on the same layer. In other embodiments, the metal connection line TWL' may be disposed on a different layer than the transparent connection line TWL and connected thereto through a contact hole.

Figure 4:
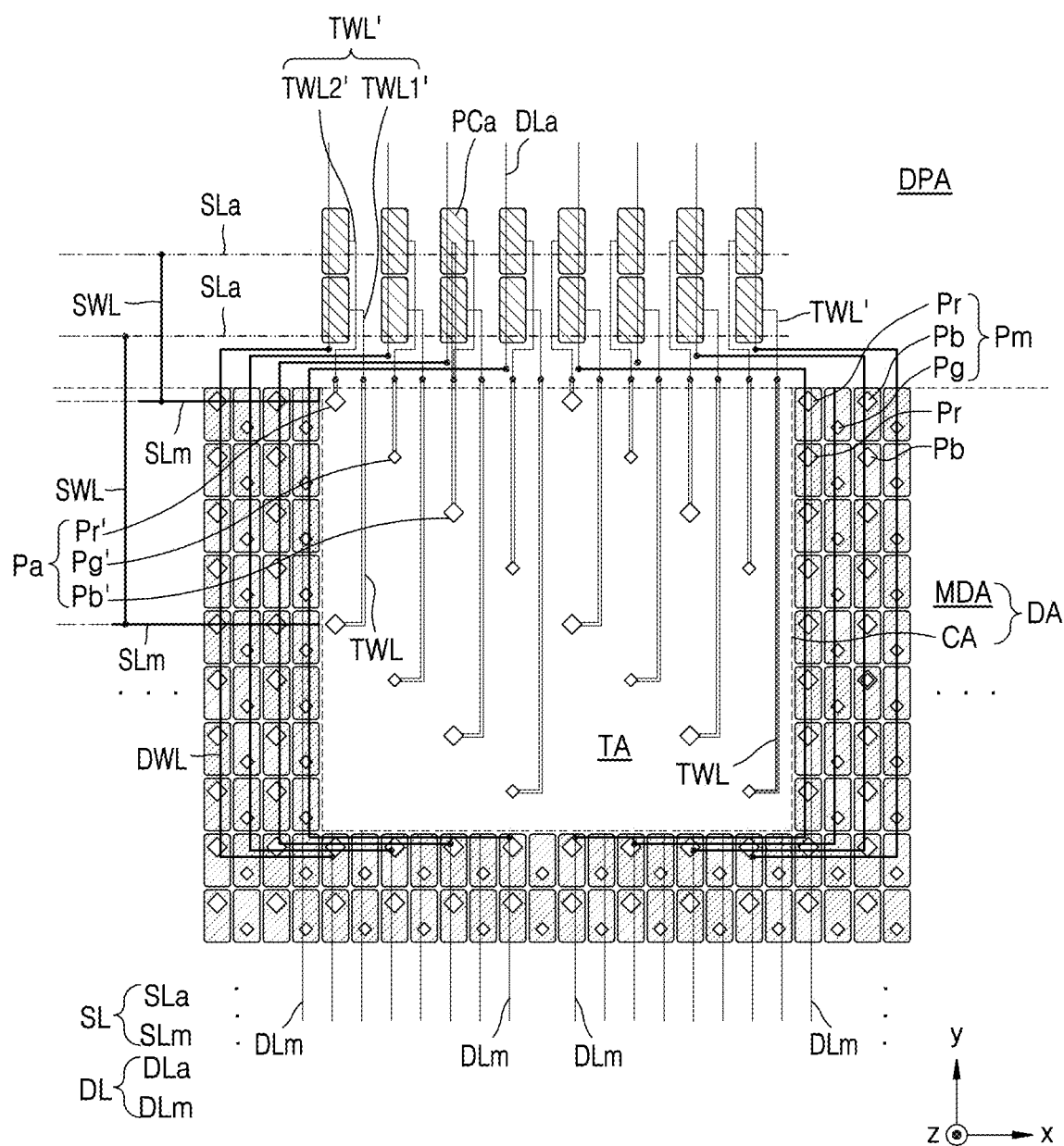
FIG. 4 is a schematic plan layout diagram illustrating a partial area of an embodiment of a display panel in the display apparatus of FIG. 1.

FIG. 4 is a schematic plan layout diagram illustrating a partial area of a display panel according to embodiments. Particularly, FIG. 4 illustrates a portion of a component area CA, a main display area MDA therearound, and a peripheral area DPA.

Referring to FIG. 4, a plurality of main subpixels Pm may be arranged in the main display area MDA. Herein, a subpixel may refer to an emission area that emits light by a display element as a minimum unit for displaying an image. Moreover, when an organic light emitting diode is used as a display element, the emission area may be defined by an opening of a pixel definition layer. This will be described below. Each of the plurality of main subpixels Pm may emit any one of red, green, blue, and white light.

In some embodiments, the main subpixels Pm arranged in the main display area MDA may include a first subpixel Pr, a second subpixel Pg, and a third subpixel Pb. The first subpixel Pr, the second subpixel Pg, and the third subpixel Pb may respectively emit red light, green light, and blue light. The main subpixels Pm may be arranged in a pentile structure.

For example, the first subpixels Pr may be arranged at the first and third vertexes facing each other among the vertexes of a virtual square having a central point of the second subpixel Pg as a central point thereof and the third subpixels Pb may be arranged at the second and fourth vertexes that are the other vertexes thereof. The size of the second subpixel Pg may be less than the sizes of the first subpixel Pr and the third subpixel Pb.

Such a pixel arrangement structure may be referred to as a pentile matrix structure or a pentile structure, and high resolution may be implemented by a small number of pixels by applying a rendering drive that represents colors by sharing adjacent pixels.

Although FIG. 4 illustrates that a plurality of main subpixels Pm are arranged in a pentile matrix structure, embodiments are not limited thereto. For example, a plurality of main subpixels Pm may be arranged in various forms such as a stripe structure, a mosaic arrangement structure, and a delta arrangement structure.

In the main display area MDA, main pixel circuits PCm may be arranged to overlap the main subpixels Pm, and the main pixel circuits PCm may be arranged in a matrix form in the x and y directions. Herein, a main pixel circuit PCm may refer to a unit of a pixel circuit that implements one main subpixel Pm.

A plurality of auxiliary subpixels Pa may be arranged in the component area CA. Each of the plurality of main subpixels Pm may emit any one of red, green, blue, and white light. The auxiliary subpixels Pa may include a first subpixel Pr', a second subpixel Pg', and a third subpixel Pb' that emit different color lights. The first subpixel Pr', the second subpixel Pg', and the third subpixel Pb' may respectively emit red light, green light, and blue light.

The number per unit area of the auxiliary subpixels Pa arranged in the component area CA may be less than the number per unit area of the main subpixels Pm arranged in the main display area MDA. For example, the number of auxiliary subpixels Pa and the number of main subpixels Pm arranged per the same area may be in the ratio of about 1:2, 1:4, 1:8, or 1:9. For example, the resolution of the component area CA may be about ½, ¼, ⅛, or ⅑ of the resolution of the main display area MDA. FIG. 4 illustrates a case where the resolution of the component area CA is about ⅛ of the resolution of the main display area MDA.

The auxiliary subpixels Pa arranged in the component area CA may be arranged in various forms. Some auxiliary subpixels Pa among the auxiliary subpixels Pa may be collected to form a pixel group and may be arranged in various forms such as a pentile structure, a stripe structure, a mosaic arrangement structure, or a delta arrangement structure in the pixel group. In this case, the distance between the auxiliary subpixels Pa arranged in the pixel group may be equal to the distance between the main subpixels Pm.

Alternatively, as illustrated in FIG. 4, the auxiliary subpixels Pa may be distributed and arranged in the component area CA. For example, the distance between the auxiliary subpixels Pa may be greater than the distance between the main subpixels Pm. Moreover, an area in which the auxiliary subpixels Pa are not arranged in the component area CA may be referred to as a transmission area TA having high light transmittance.

The auxiliary pixel circuits PCa implementing light emission of the auxiliary subpixels Pa may be arranged in the peripheral area DPA. Because the auxiliary pixel circuits PCa are not arranged in the component area CA, the component area CA may have a wider transmission area TA. Also, because lines for applying a constant voltage and signals to the auxiliary pixel circuit PCa are not arranged in the component area CA, the auxiliary subpixels Pa may be freely arranged without considering the arrangement of the lines.

The auxiliary pixel circuits PCa may be connected to the auxiliary subpixels Pa by connection lines. The connection line may include at least one transparent connection line TWL and at least one metal connection line TWL'.

The transparent connection line TWL may be at least partially arranged in the component area CA and may include a transparent conductive material. For example, the transparent connection line TWL may include a transparent conductive oxide (TCO). The transparent connection line TWL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

When the transparent connection line TWL is connected to the auxiliary subpixel Pa, it may mean that the transparent connection line TWL is electrically connected to a pixel electrode of a display element implementing the auxiliary subpixel Pa.

The transparent connection line TWL may be connected to the auxiliary pixel circuits PCa through a metal connection line TWL'. The metal connection line TWL' may be arranged in the peripheral area DPA and connected to the auxiliary pixel circuit PCa.

The metal connection line TWL' may include a conductive material including molybdenum (Mo), aluminum (Al), copper (Cu), titanium (Ti), or the like and may include a single layer or multiple layers including the above material. The metal connection line TWL' may be provided as a plurality of metal connection lines TWL' between the auxiliary pixel circuits PCa.

In some embodiments, the metal connection line TWL' may include a first metal connection line TWL1' and a second metal connection line TWL2' disposed on different layers. For example, the first metal connection line TWL1' and a data line DL may be disposed on the same layer and may be formed of the same material. The second metal connection line TWL2' may be arranged with respect to the first metal connection line TWL1' with an insulating layer therebetween. For example, the second metal connection line TWL2' and a first pixel electrode 121 (see FIG. 5A) of an organic light emitting diode OLED may be disposed on the same layer, and may be formed of the same material. Alternatively, the second metal connection line TWL2' and a connection electrode CM may be formed on the same layer and may be formed of the same material (see FIG. 5A).

The first metal connection line TWL1' and the second metal connection line TWL2' may be arranged between the auxiliary pixel circuits PCa and may be at least partially curved in the plan view. In some embodiments, the first metal connection line TWL1' and the second metal connection line TWL2' disposed on different layers may be provided as a plurality of first metal connection lines TWL1' and a plurality of second metal connection lines TWL2', and the first metal connection line TWL1' and the second metal connection line TWL2' may be alternately arranged in an area between a plurality of auxiliary pixel circuits PCa.

The transparent connection line TWL may be arranged in the component area CA and connected to the metal connection line TWL' at the edge of the component area CA. The transparent connection line TWL may include a transparent conductive material.

The metal connection line TWL' and the transparent connection line TWL may be disposed on the same layer or may be disposed on different layers. When the metal connection line TWL' and the transparent connection line TWL are disposed on different layers, they may be connected through a contact hole.

The metal connection line TWL' may have higher conductivity than the transparent connection line TWL. Because the metal connection line TWL' is arranged in the peripheral area DPA and thus there is no need to have light transmittance, the metal connection line TWL' may include a material having lower light transmittance and higher conductivity than the transparent connection line TWL. Accordingly, the resistance value of the transparent connection line TWL may be minimized.

A scan line SL may include a main scan line SLm connected to the main pixel circuits PCm and an auxiliary scan line SLa connected to the auxiliary pixel circuits PCa. The main scan line SLm may extend in the x direction and may be connected to the main pixel circuits PCm arranged in the same row. The main scan line SLm may not be arranged in the component area CA. For example, the main scan line SLm may be disconnected from each other in the component area CA therebetween. In this case, the main scan line SLm disposed on the left side of the component area CA may receive a signal from the first scan driving circuit SDRV1 (see FIG. 3A), and the main scan line SLm disposed on the right side of the component area CA Line SLm may receive a signal from the second scan driving circuit SDRV2 (see FIG. 3A).

The auxiliary scan line SLa may be connected to the auxiliary pixel circuits PCa for driving the auxiliary subpixel Pa arranged in the same row, among the auxiliary pixel circuits PCa arranged in the same row.

The main scan line SLm and the auxiliary scan line SLa may be connected by a scan connection line SWL, and thus the same signal may be applied to the pixel circuits for driving the main subpixel Pm and the auxiliary subpixel Pa arranged in the same row.

The scan connection line SWL may be disposed on a different layer than the main scan line SLm and the auxiliary scan line SLa and may be connected to the main scan line SLm and the auxiliary scan line SLa through contact holes, respectively. The scan connection line SWL may be arranged in the peripheral area DPA.

A data line DL may include a main data line DLm connected to the main pixel circuits PCm and an auxiliary data line DLa connected to the auxiliary pixel circuits PCa. The main data line DLm may extend in the y direction and may be connected to the main pixel circuits PCm arranged in the same column. The auxiliary data line DLa may extend in the y direction and may be connected to the auxiliary pixel circuits PCa arranged in the same column.

The main data line DLm and the auxiliary data line DLa may be arranged to be spaced apart from each other with the component area CA therebetween. The main data line DLm and the auxiliary data line DLa may be connected by a data connection line DWL, and thus the same signal may be applied to the pixel circuits for driving the main subpixel Pm and the auxiliary subpixel Pa arranged in the same column.

The data connection line DWL may be arranged to bypass the component area CA. For example, the data connection line DWL may not be arranged in the component area CA. The data connection line DWL may be arranged to overlap the main pixel circuits PCm arranged in the main display area MDA. As the data connection line DWL is arranged in the main display area MDA, because it is not necessary to have a separate space in which the data connection line DWL is arranged, a dead-space area may be minimized.

The data connection line DWL may be disposed on a different layer than the main data line DLm and the auxiliary data line DLa, and thus, the data connection line DWL may be connected to the main data line DLm and the auxiliary data line DLa through contact holes, respectively.

Figure 5A:
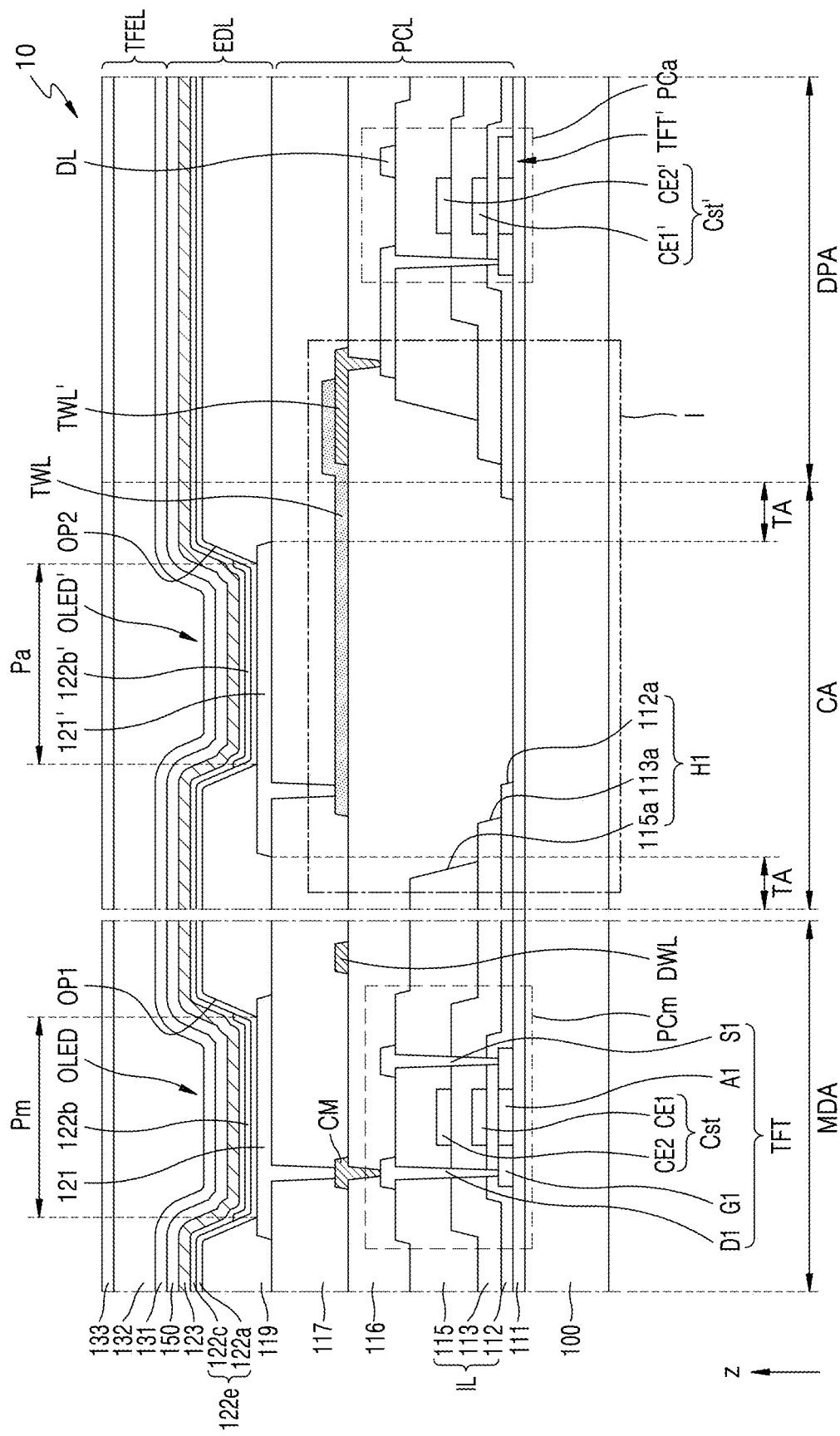
FIGS. 5A and 5B are schematic cross-sectional views illustrating portions of embodiments of a display panel in the display apparatus of FIG. 1.
Figure 6:
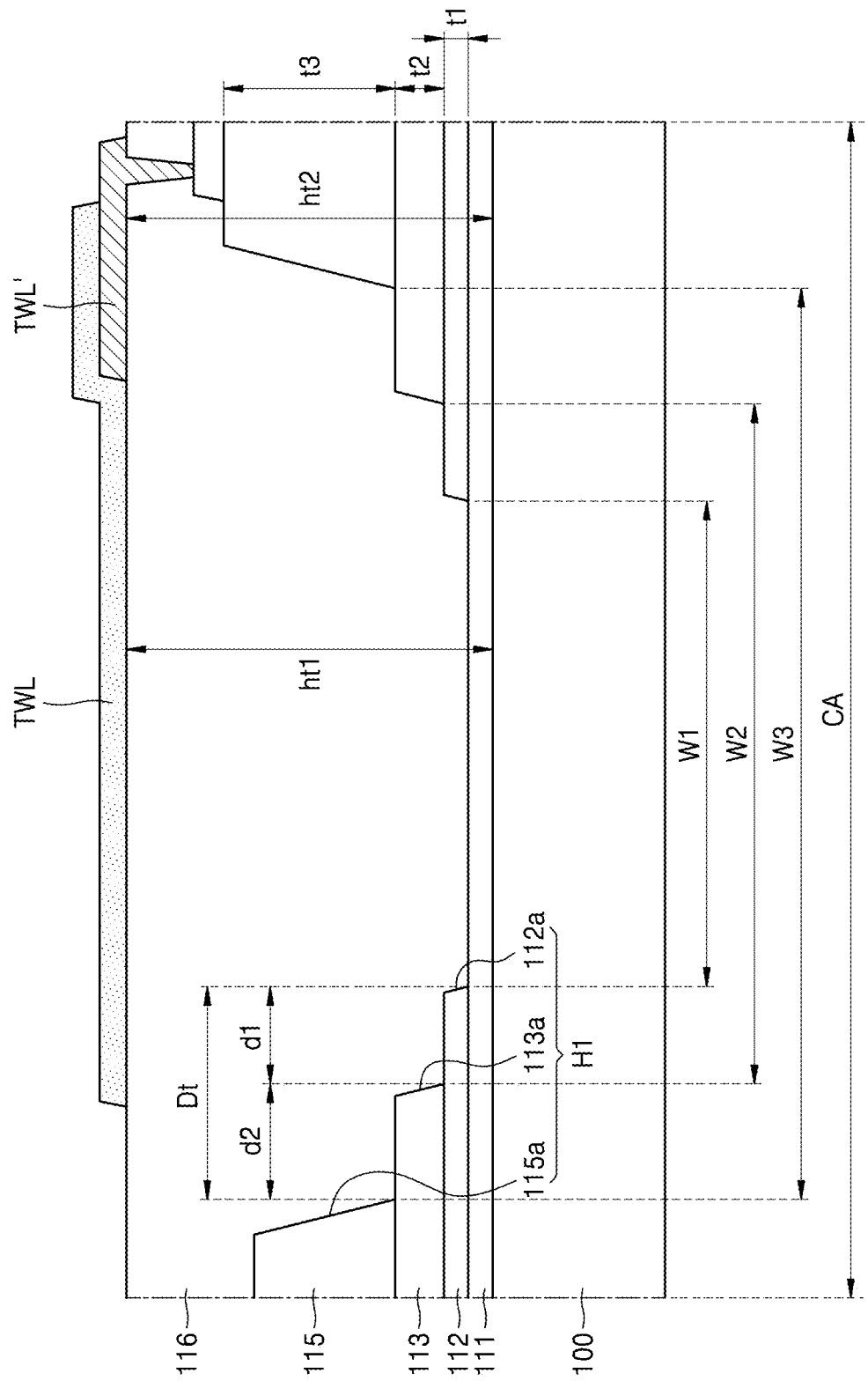
FIG. 6 is a partial enlarged view illustrating region I of FIG. 5A.

FIG. 5A is a schematic cross-sectional view illustrating a portion of a display panel 10 according to an embodiment, which is a cross-sectional view schematically illustrating a portion of a main display area MDA, a component area CA, and a peripheral area DPA. FIG. 6 is a partial enlarged view illustrating region I of FIG. 5A.

Referring to FIG. 5A, a main subpixel Pm may be arranged in the main display area MDA, and the component area CA may include an auxiliary subpixel Pa and a transmission area TA. A main pixel circuit PCm including a main thin film transistor TFT and a main storage capacitor Cst, and a main organic light emitting diode OLED as a main display element connected to the main pixel circuit PCm may be arranged in the main display area MDA. An auxiliary organic light emitting diode OLED' as an auxiliary display element may be arranged in the component area CA. An auxiliary pixel circuit PCa including an auxiliary thin film transistor TFT' and an auxiliary storage capacitor Cst' may be arranged in the peripheral area DPA. Moreover, a transparent connection line TWL connecting the auxiliary pixel circuit PCa to the auxiliary organic light emitting diode OLED' may be arranged in the component area CA and the peripheral area DPA.

In the component area CA, a first organic insulating layer 116 and a second organic insulating layer 117 may be stacked and provided between the substrate 100 and the auxiliary organic light emitting diode OLED', and the transparent connection line TWL may be arranged between the first organic insulating layer 116 and the second organic insulating layer 117.

In an embodiment, an inorganic insulating layer IL arranged over the substrate 100 may include an opening H1 corresponding to the component area CA, and a stair-shaped step difference may be provided at a sidewall defining the opening H1.

The first organic insulating layer 116 may fill the inside of the opening H1 of the inorganic insulating layer IL. The first organic insulating layer 116 may be arranged over the entire surface of the main display area MDA and the component area CA.

By forming the opening H1 in the inorganic insulating layer IL corresponding to the component area CA, the light transmittance of the component area CA may be improved. Moreover, when the side surface of the opening H1 of the inorganic insulating layer IL is steep, the upper surface of the first organic insulating layer 116 filling the opening H1 may not be flat and a step difference may be formed at the boundary between the main display area MDA and the component area CA. Due to the step difference, a defect may be caused when a member, for example, the transparent connection line TWL, disposed on the upper surface of the first organic insulating layer 116 is processed.

In an embodiment, by forming the side surface of the opening H1 of the inorganic insulating layer IL in a stair shape, the flatness of the upper surface of the first organic insulating layer 116 may be improved. Thus, a defect of the transparent connection line TWL or the like may be minimized.

Moreover, in an embodiment, as an example, an organic light emitting diode is used as a display element; however, in other embodiments, an inorganic light emitting element or a quantum dot light emitting element may be used as a display element.

Hereinafter, a structure in which the components included in the display panel 10 are stacked will be described. The display panel 10 may include a stack of a substrate 100, a buffer layer 111, a circuit layer PCL, and a display element layer EDL.

The substrate 100 may include an insulating material such as glass, quartz, or polymer resin. The substrate 100 may include a rigid substrate or a flexible substrate capable of bending, folding, rolling, or the like.

The buffer layer 111 may be over the substrate 100 to reduce or block the penetration of foreign materials, moisture, or external air from the bottom of the substrate 100 and may provide a flat surface over the substrate 100. The buffer layer 111 may include an inorganic material such as oxide or nitride, an organic material, or an organic/inorganic composite and may include a single-layer or multiple-layer structure of an inorganic material and an organic material. A barrier layer for blocking the penetration of external air may be further included between the substrate 100 and the buffer layer 111. In some embodiments, the buffer layer 111 may include silicon oxide ($SiO_2$) or silicon nitride ($SiN_x$).

The circuit layer PCL may be arranged over the buffer layer 111 and may include a main pixel circuit PCm, an auxiliary pixel circuit PCa, a first gate insulating layer 112, a second gate insulating layer 113, an interlayer insulating layer 115, a first organic insulating layer 116, and a second organic insulating layer 117. The main pixel circuit PCm may include a main thin film transistor TFT and a main storage capacitor Cst, and the auxiliary pixel circuit PCa may include an auxiliary thin film transistor TFT' and an auxiliary storage capacitor Cst'.

The main thin film transistor TFT and the auxiliary thin film transistor TFT' may be arranged over the buffer layer 111. The main thin film transistor TFT may include a first semiconductor layer A1, a first gate electrode G1, a first source electrode S1, and a first drain electrode D1. The main thin film transistor TFT may be connected to the main organic light emitting diode OLED to drive the main organic light emitting diode OLED. The auxiliary thin film transistor TFT' may be connected to the auxiliary organic light emitting diode OLED' to drive the auxiliary organic light emitting diode OLED'. The auxiliary thin film transistor TFT' has a similar configuration to the main thin film transistor TFT, and thus, a description of the auxiliary thin film transistor TFT' will be replaced with the description of the main thin film transistor TFT.

The first semiconductor layer A1 may be arranged over the buffer layer 111 and may include polysilicon. In other embodiments, the first semiconductor layer A1 may include amorphous silicon. In other embodiments, the first semiconductor layer A1 may include an oxide of at least one of indium (In), gallium (Ga), tin (Sn), zirconium (Zr), vanadium (V), hafnium (Hf), cadmium (Cd), germanium (Ge), chromium (Cr), titanium (Ti), and zinc (Zn). The first semiconductor layer A1 may include a channel area and a source area and a drain area that are doped with dopants.

The first gate insulating layer 112 may be provided to cover the first semiconductor layer A1. The first gate insulating layer 112 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may include a single layer or multiple layers including the above inorganic insulating material.

The first gate electrode G1 may be arranged over the first gate insulating layer 112 to overlap the first semiconductor layer A1. The first gate electrode G1 may include molybdenum (Mo), aluminum (Al), copper (Cu), titanium (Ti), or the like and may include a single layer or multiple layers. For example, the first gate electrode G1 may include a single Mo layer.

The second gate insulating layer 113 may be provided to cover the first gate electrode G1. The second gate insulating layer 113 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may include a single layer or multiple layers including the above inorganic insulating material.

An upper electrode CE2 of the main storage capacitor Cst and an upper electrode CE2' of the auxiliary storage capacitor Cst' may be arranged over the second gate insulating layer 113.

In the main display area MDA, the upper electrode CE2 of the main storage capacitor Cst may overlap the first gate electrode G1 thereunder. The first gate electrode G1 and the upper electrode CE2 overlapping each other with the second gate insulating layer 113 therebetween may constitute the main storage capacitor Cst. The first gate electrode G1 may be a lower electrode CE1 of the main storage capacitor Cst.

In the main display area MDA, the upper electrode CE2' of the auxiliary storage capacitor Cst' may overlap the gate electrode of the auxiliary thin film transistor TFT' thereunder. The gate electrode of the auxiliary thin film transistor TFT' may be a lower electrode CE1' of the auxiliary storage capacitor Cst'.

The upper electrode CE2 of the main storage capacitor Cst and the upper electrode CE2' of the auxiliary storage capacitor Cst' may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or multiple layers of the above material.

The interlayer insulating layer 115 may be formed to cover the upper electrode CE2 of the main storage capacitor Cst and the upper electrode CE2' of the auxiliary storage capacitor Cst'. The interlayer insulating layer 115 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 115 may include a single layer or multiple layers including the above inorganic insulating material.

The source electrode S1 and the drain electrode D1 may be arranged over the interlayer insulating layer 115. The source electrode S1 and the drain electrode D1 may include a conductive material including molybdenum (Mo), aluminum (Al), copper (Cu), titanium (Ti), or the like and may include a single layer or multiple layers including the above material. For example, the source electrode S1 and the drain electrode D1 may include a multilayer structure of Ti/Al/Ti.

The inorganic insulating layer IL of the display panel 10 may include the opening H1 corresponding to the component area CA. For example, when the first gate insulating layer 112, the second gate insulating layer 113, and the interlayer insulating layer 115 are collectively referred to as an inorganic insulating layer IL, the inorganic insulating layer IL may include an opening H1 corresponding to the transmission area TA. The opening H1 may expose a portion of the upper surface of the substrate 100 or the buffer layer 111. The opening H1 may overlap a first opening 112a of the first gate insulating layer 112, a second opening 113a of the second gate insulating layer 113, and a third opening 115a of the interlayer insulating layer 115 formed to correspond to the component area CA. The first, second, and third openings 112a, 113a, and 115a may be separately formed through separate processes or may be simultaneously formed through the same process. The first organic insulating layer 116 may fill the inside of the opening H1 of the inorganic insulating layer IL.

In an embodiment, the inner surface of the opening H1 may not be smooth and may have a stair-shaped step difference. For example, the first opening 112a, the second opening 113a, and the third opening 115a forming the opening H1 of the inorganic insulating layer IL may have different widths.

Referring to FIG. 6 that is an enlarged view of region I of FIG. 5A, the area of the first opening 112a may be less than the area of the second opening 113a. Alternatively, a first width W1 of the first opening 112a may be less than a second width W2 of the second opening 113a such that a portion of the body of the first gate insulating layer 112 may be exposed by the second gate insulating layer 113.

Also, the second width W2 of the second opening 113a may be less than a third width W3 of the third opening 115a such that a portion of the body of the second gate insulating layer 113 may be exposed by the interlayer insulating layer 115.

A first distance d1 that is the distance between the end of the inner surface of the first opening 112a and the end of the inner surface of the second opening 113a and a second distance d2 that is the distance between the end of the inner surface of the second opening 113a and the end of the inner surface of the third opening 115a may be set by considering the flatness of the upper surface of the first organic insulating layer 116 and the area of the opening H1.

Here, the end of the inner surface of the opening may mean a point where the inner surface of the opening and the upper surface of the insulating layer thereunder meet each other.

As the first distance d1 and the second distance d2 increase, the flatness of the first organic insulating layer 116 may increase but the area of the opening H1 may decrease and thus the light transmittance of the component area CA may decrease. Thus, the first distance d1 and the second distance d2 may be greater than or equal to a certain first value, and a sum Dt of the first distance d1 and the second distance d2 may be less than or equal to a certain second value.

In some embodiments, each of the first distance d1 and the second distance d2 may be about 2 μm or more, and the sum of the first distance d1 and the second distance d2 may be within about 25 μm. In this case, when the first organic insulating layer 116 has a first height ht1 from the upper surface of the substrate 100 inside the opening H1 and has a second height ht2 from the upper surface of the substrate 100 outside the opening H1, the difference between the first height ht1 and the second height ht2 may be about 30 nm or less. In some embodiments, each of a thickness t1 of the first gate insulating layer 112 and a thickness t2 of the second gate insulating layer 113 may be about 1,000 Å to about 1,500 Å. A thickness t3 of the interlayer insulating layer 115 may be about 3,000 Å to about 6,000 Å. In this case, the first height ht1 of the first organic insulating layer 116 inside the opening H1 may be about 2 μm.

The first organic insulating layer 116 may cover the source electrodes S1 and S2 and the drain electrodes D1 and D2 in the main display area MDA and the peripheral area DPA and may fill the opening H1 of the inorganic insulating layer IL in the component area CA.

The first organic insulating layer 116 may include a general-purpose polymer such as photosensitive polyimide, polyimide, polystyrene (PS), polycarbonate (PC), benzocyclobutene (BCB), hexamethyldisiloxane (HMDSO), or polymethylmethacrylate (PMMA), a polymer derivative having a phenolic group, an acrylic polymer, an imide-based polymer, an aryl ether-based polymer, an amide-based polymer, a fluorine-based polymer, a p-xylene-based polymer, or a vinyl alcohol-based polymer.

Alternatively, the first organic insulating layer 116 may include a siloxane-based organic material. The siloxane-based organic material may include hexamethyldisiloxane, octamethyltrisiloxane, decamethyltetrasiloxane, dodecamethylpentasiloxane, and polydimethylsiloxane.

A refractive index n1 of the first organic insulating layer 116 may be about 1.4 to about 1.6 for a wavelength of about 550 nm. Connection electrodes CM and CM' and various lines, for example, data lines DL, may be arranged over the first organic insulating layer 116, which may be advantageous for high integration.

Moreover, a transparent connection line TWL may be provided over the first organic insulating layer 116 in the component area CA. The transparent connection line TWL may be arranged to extend from the peripheral area DPA to the component area CA to connect the auxiliary organic light emitting diode OLED' to the auxiliary pixel circuit PCa.

The transparent connection line TWL may be connected to a metal connection line TWL'. The metal connection line TWL' may be arranged in the peripheral area DPA and connected to the auxiliary pixel circuit PCa, for example, the auxiliary thin film transistor TFT'. The transparent connection line TWL may be arranged in the transmission area TA of the component area CA. The end of the transparent connection line TWL may be provided to cover the end of the metal connection line TWL'.

The metal connection line TWL' may include a conductive material including molybdenum (Mo), aluminum (Al), copper (Cu), titanium (Ti), or the like and may include a single layer or multiple layers including the above material. In some embodiments, the metal connection line TWL' may include the same material, of which the data line DL is formed. For example, the metal connection line TWL' and the data line DL may be disposed on the same layer. However, embodiments are not limited thereto. The metal connection line TWL' may be disposed on various layers. For example, the metal connection line TWL' and the first pixel electrode 121 may be disposed on the same layer.

The transparent connection line TWL may include a transparent conductive material. For example, the transparent connection line TWL may include a transparent conductive oxide (TCO). The transparent connection line TWL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The metal connection line TWL' may have higher conductivity than the transparent connection line TWL. Because the metal connection line TWL' is arranged in the peripheral area DPA and thus there is no need to have light transmittance, the metal connection line TWL' may include a material having lower light transmittance and higher conductivity than the transparent connection line TWL.

The second organic insulating layer 117 may be arranged over the first organic insulating layer 116 to cover the transparent connection line TWL. The second organic insulating layer 117 may have a flat upper surface such that a first pixel electrode 121 and a second pixel electrode 121' arranged thereover may be flat. The second organic insulating layer 117 may include a siloxane-based organic material having high light transmittance and high flatness. The siloxane-based organic material may include hexamethyldisiloxane, octamethyltrisiloxane, decamethyltetrasiloxane, dodecamethylpentasiloxane, and polydimethylsiloxane.

Alternatively, the second organic insulating layer 117 may include a general-purpose polymer such as photosensitive polyimide, polyimide, benzocyclobutene (BCB), hexamethyldisiloxane (HMDSO), polymethylmethacrylate (PMMA), or polystyrene (PS), a polymer derivative having a phenolic group, an acrylic polymer, an imide-based polymer, an aryl ether-based polymer, an amide-based polymer, a fluorine-based polymer, a p-xylene-based polymer, or a vinyl alcohol-based polymer.

The main organic light emitting diode OLED and the auxiliary organic light emitting diode OLED' may be arranged over the second organic insulating layer 117. The first pixel electrode 121 of the main organic light emitting diode OLED may be connected to the main pixel circuit PCm through the connection electrode CM arranged over the first organic insulating layer 116. The second pixel electrode 121' of the auxiliary organic light emitting diode OLED' may be connected to the auxiliary pixel circuit PCa through the connection electrode CM's arranged over the first organic insulating layer 116.

The first pixel electrode 121 and the second pixel electrode 121' may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The first pixel electrode 121 and the second pixel electrode 121' may include a reflection layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. For example, the first pixel electrode 121 and the second pixel electrode 121' may have a structure including layers formed of ITO, IZO, ZnO, or $In_2O_3$ over/under the reflection layer. In this case, the first pixel electrode 121 and the second pixel electrode 121' may have a stack structure of ITO/Ag/ITO.

A pixel definition layer 119 may cover the edges of the first pixel electrode 121 and the second pixel electrode 121' over the second organic insulating layer 117 and may include a first opening OP1 and a second opening OP2 for exposing the central portions of the first pixel electrode 121 and the second pixel electrode 121'. The first opening OP1 and the second opening OP2 may define the emission areas of the main organic light emitting diode OLED and the auxiliary organic light emitting diode OLED', e.g., the sizes and shapes of the main subpixel Pm and the auxiliary subpixel Pa.

The pixel definition layer 119 may increase the distance between the edge of the first and second pixel electrodes 121 and 121' and an opposite electrode 123 over the first and second pixel electrodes 121 and 121' to prevent an arc or the like from occurring at the edge of the first and second pixel electrodes 121 and 121'. The pixel definition layer 119 may be formed of an organic insulating material such as polyimide, polyamide, acrylic resin, benzocyclobutene, hexamethyldisiloxane (HMDSO), or phenol resin by spin coating or the like.

A first emission layer 122b and a second emission layer 122b' formed to respectively correspond to the first pixel electrode 121 and the second pixel electrode 121' may be arranged inside the first opening OP1 and the second opening OP2 of the pixel definition layer 119. The first emission layer 122b and the second emission layer 122b' may include a high molecular weight material or a low molecular weight material and may emit red, green, blue, or white light.

An organic functional layer 122e may be arranged over and/or under the first emission layer 122b and the second emission layer 122b'. The organic functional layer 122e may include a first functional layer 122a and/or a second functional layer 122c. The first functional layer 122a or the second functional layer 122c may be omitted.

The first functional layer 122a may be arranged under the first emission layer 122b and the second emission layer 122b'. The first functional layer 122a may include a single layer or multiple layers including an organic material. The first functional layer 122a may include a hole transport layer (HTL) having a single-layer structure. Alternatively, the first functional layer 122a may include a hole injection layer (HIL) and an HTL. The first functional layer 122a may be integrally formed to correspond to the main organic light emitting diode OLED in the main display area MDA and the auxiliary organic light emitting diode OLED' in the component area CA.

The second functional layer 122c may be arranged over the first emission layer 122b and the second emission layer 122b'. The second functional layer 122c may include a single layer or multiple layers including an organic material. The second functional layer 122c may include an electron transport layer (ETL) and/or an electron injection layer (EIL). The second functional layer 122c may be integrally formed to correspond to the main organic light emitting diode OLED in the main display area MDA and the auxiliary organic light emitting diode OLED' in the component area CA.

The opposite electrode 123 may be arranged over the second functional layer 122c. The opposite electrode 123 may include a conductive material having a low work function. For example, the opposite electrode 123 may include a transparent layer or a semi-transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 123 may further include a layer such as ITO, IZO, ZnO, or $In_2O_3$ over the transparent layer or the semi-transparent layer including the above material. The opposite electrode 123 may be integrally formed to correspond to the main organic light emitting diode OLED in the main display area MDA and the auxiliary organic light emitting diode OLED' in the component area CA.

The layers from the first pixel electrode 121 to the opposite electrode 123 formed in the main display area MDA may constitute the main organic light emitting diode OLED. The layers from the second pixel electrode 121' to the opposite electrode 123 formed in the component area CA may constitute the auxiliary organic light emitting diode OLED'.

A top layer 150 including an organic material may be formed over the opposite electrode 123. The top layer 150 may be provided to protect the opposite electrode 123 and improve light extraction efficiency. The top layer 150 may include an organic material having a higher refractive index than the opposite electrode 123. Alternatively, the top layer 150 may include a stack of layers having different refractive indexes. For example, the top layer 150 may include a stack of a high refractive index layer/a low refractive index layer/a high refractive index layer. In this case, the refractive index of the high refractive index layer may be about 1.7 or more, and the refractive index of the low refractive index layer may be about 1.3 or less.

The top layer 150 may further include LiF. Alternatively, the top layer 150 may further include an inorganic insulating material such as silicon oxide ($SiO_2$) or silicon nitride ($SiN_x$).

A thin film encapsulation layer TFEL may be arranged over the top layer 150, and the main organic light emitting diode OLED and the auxiliary organic light emitting diode OLED' may be encapsulated by the thin film encapsulation layer TFEL. The thin film encapsulation layer TFEL may prevent external moisture or foreign substances from penetrating or permeating into the main organic light emitting diode OLED and the auxiliary organic light emitting diode OLED'.

The thin film encapsulation layer TFEL may include at least one inorganic encapsulation layer and at least one organic encapsulation layer, and in this regard, FIG. 5 illustrates a structure in which a first inorganic encapsulation layer 131, an organic encapsulation layer 132, and a second inorganic encapsulation layer 133 are stacked. In other embodiments, the number of organic encapsulation layers, the number of inorganic encapsulation layers, and the stacking order thereof may be modified.

The first inorganic encapsulation layer 131 and the second inorganic encapsulation layer 133 may include one or more inorganic insulating materials such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$) and may be formed by CVD or the like. The organic encapsulation layer 132 may include a polymer-based material. The polymer-based material may include silicon-based resin, acryl-based resin, epoxy-based resin, polyimide, polyethylene, or the like. The first inorganic encapsulation layer 131, the organic encapsulation layer 132, and the second inorganic encapsulation layer 133 may be integrally formed to cover the main display area MDA and the component area CA.

Figure 5B:
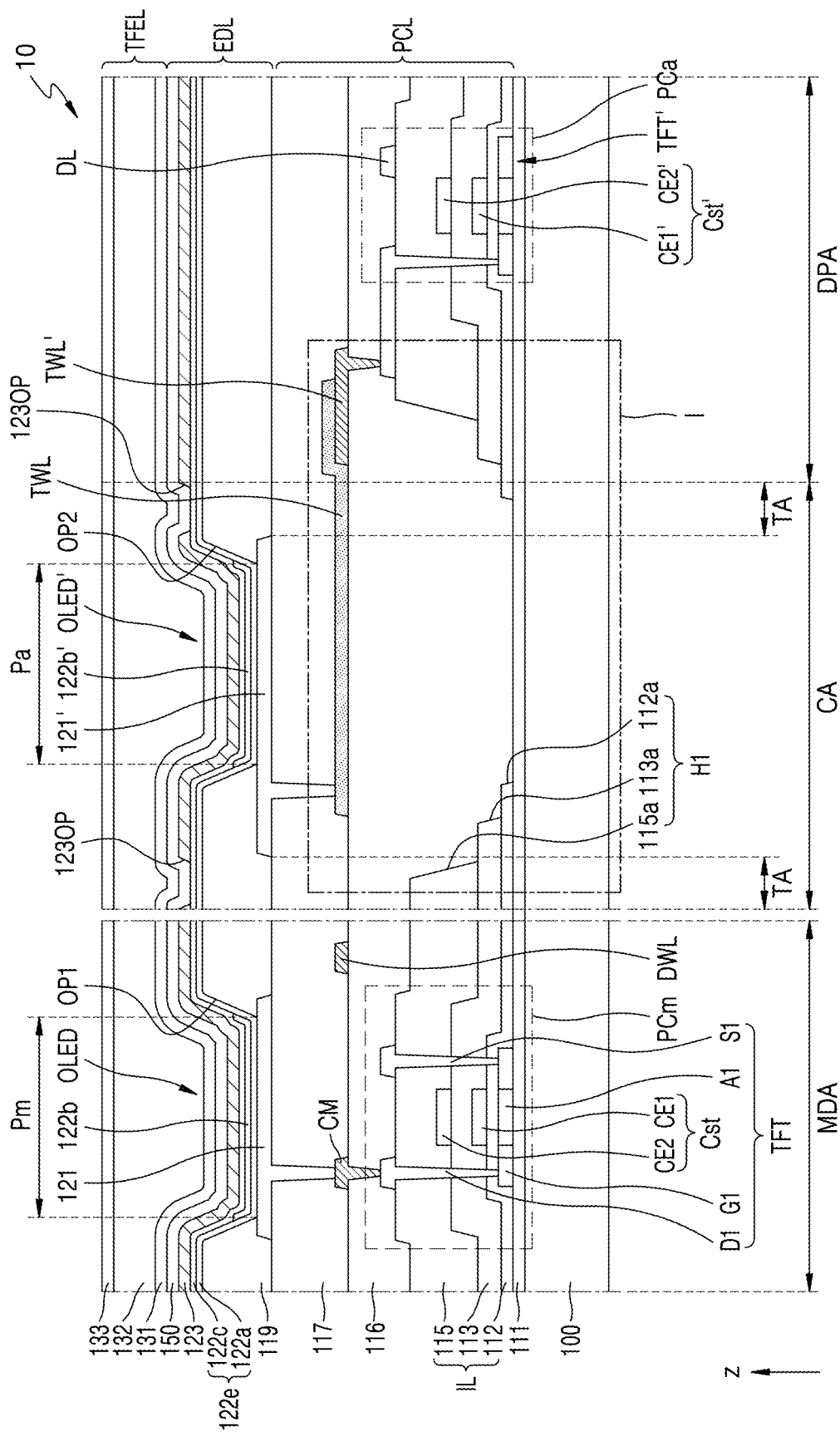

Although 5A illustrates that the opposite electrode 123 is entirely formed in the main display area MDA and the component area CA, embodiments are not limited thereto. As illustrated in FIG. 5B, the opposite electrode 123 may have an opening 123OP corresponding to the transmission area TA of the component area CA. Accordingly, the light transmittance of the transmission area TA may be further improved.

Figure 7:
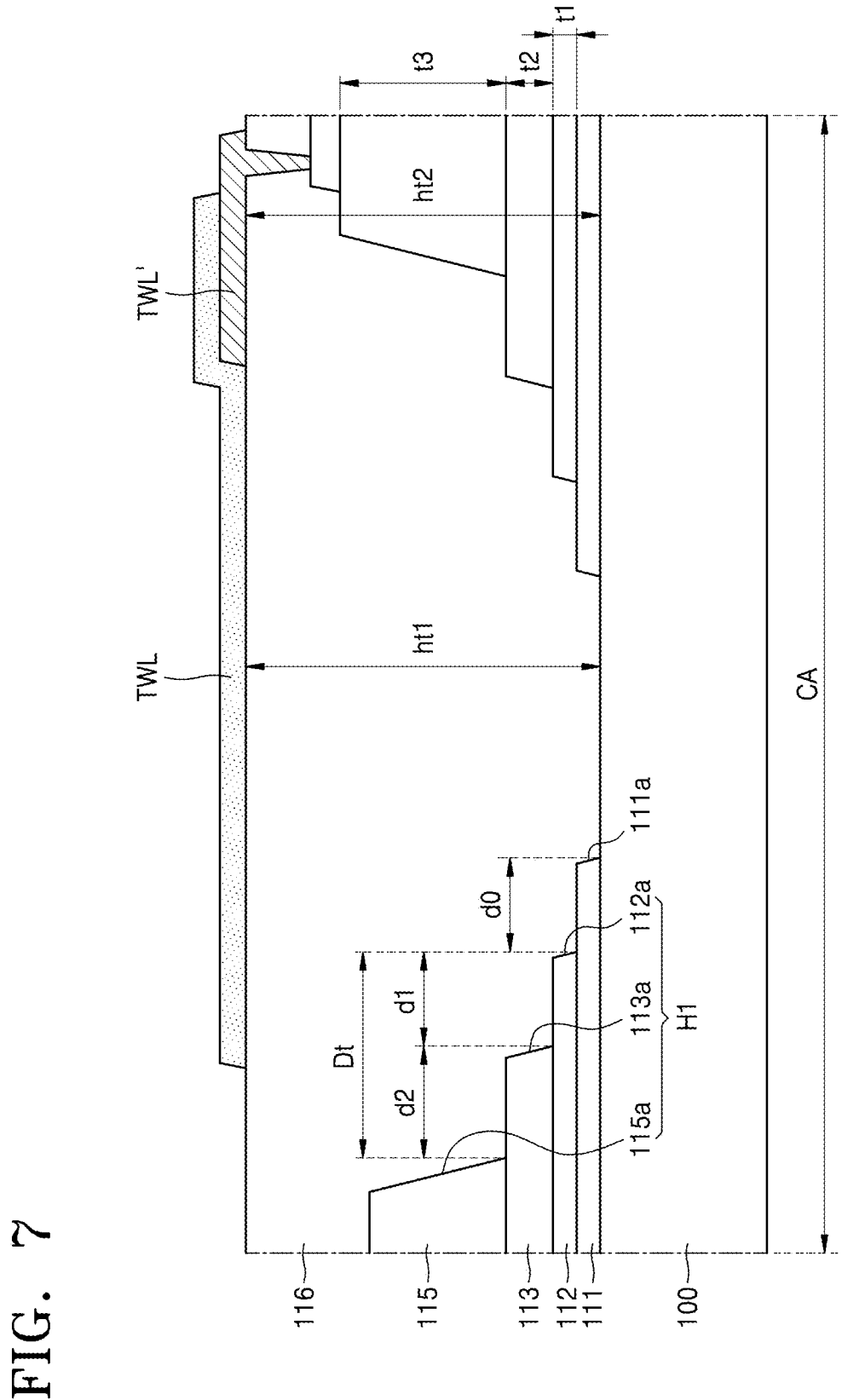
FIG. 7 is a schematic cross-sectional view illustrating a portion of an embodiment of a display panel in the display apparatus of FIG. 1.
Figure 8:
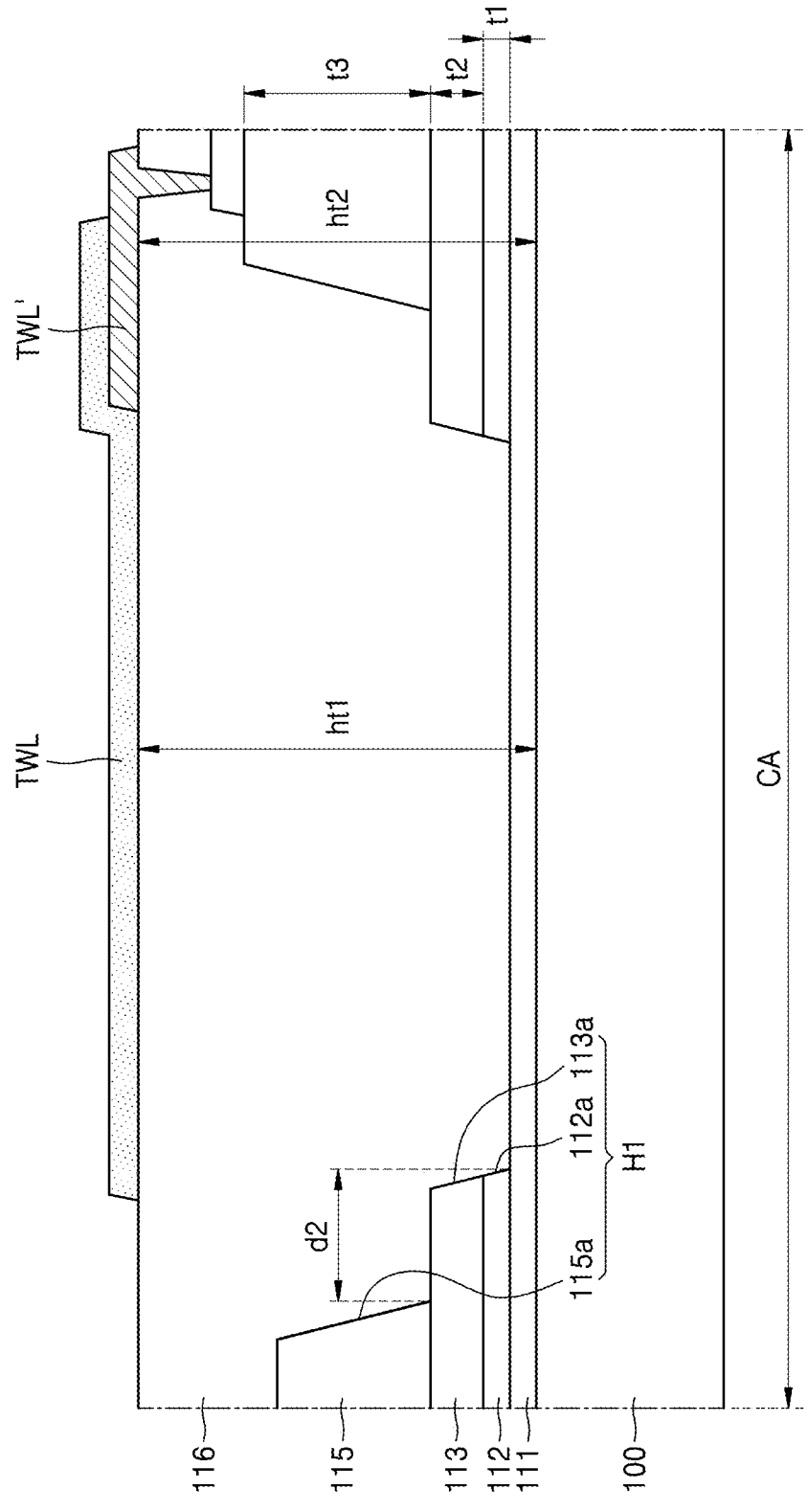
FIG. 8 is a schematic cross-sectional view illustrating a portion of another embodiment of a display panel in the display apparatus of FIG. 1.
Figure 9:
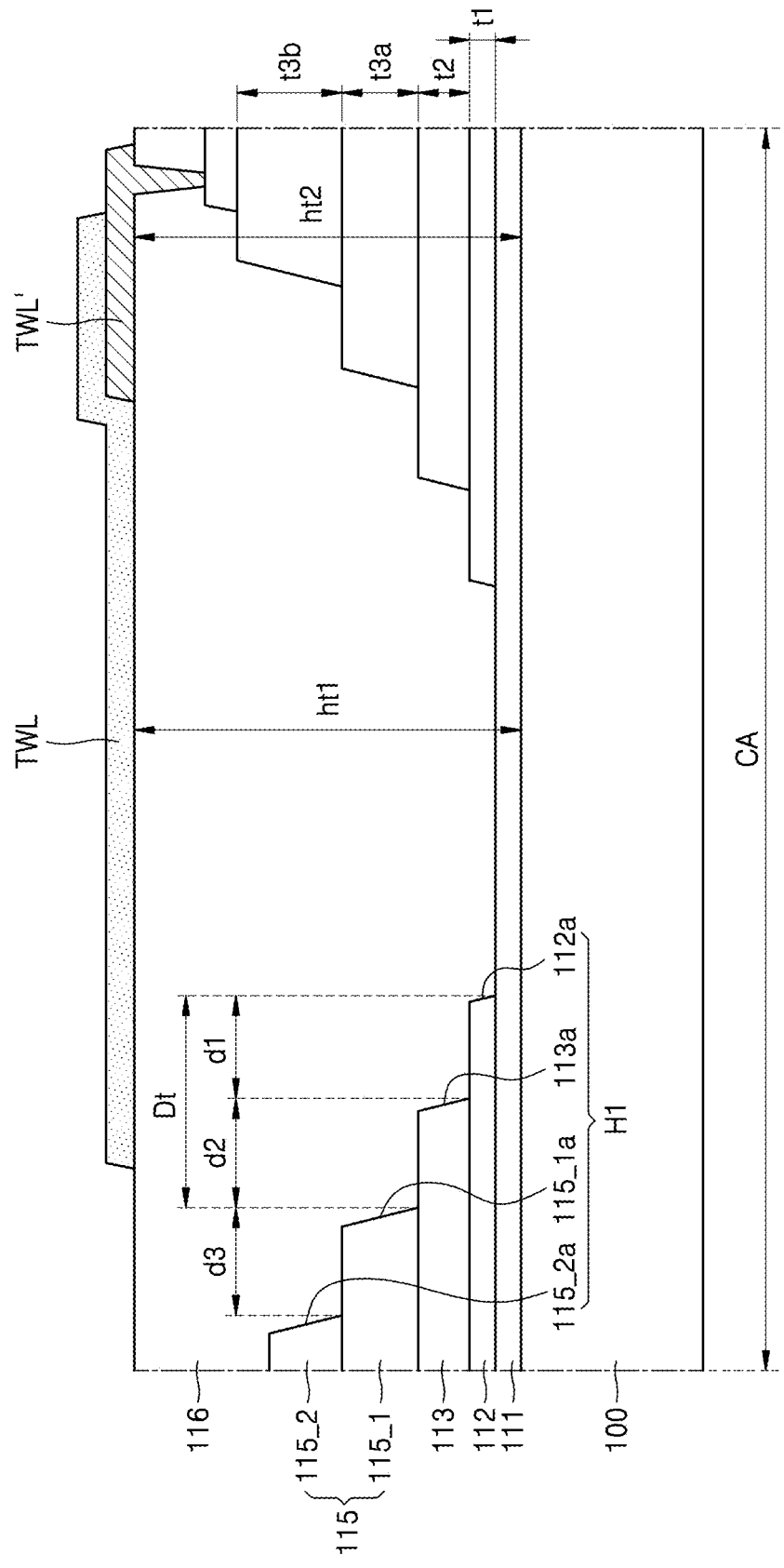
FIG. 9 is a schematic cross-sectional view illustrating a portion of an embodiment of a display panel in the display apparatus of FIG. 1.

FIGS. 7, 8, and 9 are schematic cross-sectional views illustrating a portion of a display panel according to embodiments. In FIGS. 7, 8, and 9, like reference numerals as those in FIGS. 5A and 6 denote like members, and thus redundant descriptions thereof will be omitted for descriptive convenience.

Referring to FIG. 7, the inorganic insulating layer IL including the first gate insulating layer 112, the second gate insulating layer 113, and the interlayer insulating layer 115 in the component area CA may include an opening H1. The inner surface of the opening H1 may not be smooth and may have a stair-shaped step difference. For example, the first opening 112a, the second opening 113a, and the third opening 115a forming the opening H1 of the inorganic insulating layer IL may have different areas and widths.

A first distance d1 that is the distance between the end of the inner surface of the first opening 112a and the end of the inner surface of the second opening 113a and a second distance d2 that is the distance between the end of the inner surface of the second opening 113a and the end of the inner surface of the third opening 115a may be set by considering the flatness of the upper surface of the first organic insulating layer 116 and the area of the opening H1.

As the first distance d1 and the second distance d2 increase, the flatness of the first organic insulating layer 116 may increase but the area of the opening H1 may decrease and thus the light transmittance of the component area CA may decrease. Thus, the first distance d1 and the second distance d2 may be greater than or equal to a certain first value, and a sum Dt of the first distance d1 and the second distance d2 may be less than or equal to a certain second value.

In some embodiments, each of the first distance d1 and the second distance d2 may be about 2 μm or more, and the sum of the first distance d1 and the second distance d2 may be within about 25 μm.

In an embodiment, the buffer layer 111 arranged between the substrate 100 and the inorganic insulating layer IL may include a buffer-opening 111a corresponding to the component area CA. As the buffer layer 111 includes the buffer-opening 111a, the light transmittance of the component area CA may be further improved.

In this case, a step difference may also be formed between the first gate insulating layer 112 and the buffer layer 111. In some embodiments, a distance d0 between the inner surface of the first opening 112a and the inner surface of the buffer-opening 111a may be about 2 μm or more. However, embodiments are not limited thereto. The inner side of the first opening 112a and the inner side of the buffer-opening 111a may be disposed on one plane. For example, the distance d0 between the inner surface of the first opening 112a and the inner surface of the buffer-opening 111a may be 0 (zero). The distance d0 may be set by considering the flatness of the upper surface of the first organic insulating layer 116 filling the opening H1.

Likewise, referring to FIG. 8, the first opening 112a of the first gate insulating layer 112 and the second opening 113a of the second gate insulating layer 113 may not form a step difference. For example, the inner surface of the first opening 112a and the inner surface of the second opening 113a may be disposed on one plane. For example, the inner surface of the first opening 112a and the inner surface of the second opening 113a may meet each other (d1=0).

In this case, the sum of a thickness t1 of the first gate insulating layer 112 and a thickness t2 of the second gate insulating layer 113 may be about 3,000 Å or less. When the sum of the thickness t1 of the first gate insulating layer 112 and the thickness t2 of the second gate insulating layer 113 is not great, the influence on the flatness of the upper surface of the first organic insulating layer 116 may be incomplete. When the sum of the thicknesses of the insulating layers stacked as such is about 3,000 Å or less, a step difference may not be formed.

Referring to FIG. 9, the inorganic insulating layer IL including the first gate insulating layer 112, the second gate insulating layer 113, and the interlayer insulating layer 115 in the component area CA may include an opening H1. The inner surface of the opening H1 may not be smooth and may have a stair-shaped step difference.

In an embodiment, the interlayer insulating layer 115 may include a stack of a first interlayer insulating layer 115_1 and a second interlayer insulating layer 115_2. The first interlayer insulating layer 115_1 and the second interlayer insulating layer 115_2 may include different materials. For example, the first interlayer insulating layer 115a may include silicon oxide ($SiO_X$), and the second interlayer insulating layer 115b may include silicon nitride ($SiN_X$). In this case, a (3-1)th opening 115_1a of the first interlayer insulating layer 115_1 and a (3-2)th opening 115_2a of the second interlayer insulating layer 115_2 may form a step difference.

For example, the first opening 112a, the second opening 113a, the (3-1)th opening 115_1a, and the (3-2)th opening 115_2a forming the opening H1 of the inorganic insulating layer IL may have different widths.

A first distance d1 along the upper surface of the substrate 100 between the inner surface of the first opening 112a and the inner surface of the second opening 113a, a second distance d2 along the upper surface of the substrate 100 between the inner surface of the second opening 113a and the inner surface of the (3-1)th opening 115_1a, and a third distance d3 between the inner surface of the (3-1)th opening 115_1a and the inner surface of the (3-2)th opening 115_2a may be set by considering the flatness of the upper surface of the first organic insulating layer 116 and the area of the opening H1.

As the first distance d1 and the second distance d2 increase, the flatness of the first organic insulating layer 116 may increase but the area of the opening H1 may decrease and thus the light transmittance of the component area CA may decrease. Thus, the first distance d1, the second distance d2, and the third distance d3 may be greater than or equal to a certain first value, and a sum Dt of the first distance d1, the second distance d2, and the third distance d3 may be less than or equal to a certain second value.

In some embodiments, each of the first distance d1, the second distance d2, and the third distance d3 may be about 2 μm or more, and the sum Dt of the first distance d1, the second distance d2, and the third distance d3 may be about 25 μm or less. In this case, when the first organic insulating layer 116 has a first height ht1 from the upper surface of the substrate 100 inside the opening H1 and has a second height ht2 from the upper surface of the substrate 100 outside the opening H1, the difference between the first height ht1 and the second height ht2 may be about 30 nm or less. In some embodiments, each of a thickness t1 of the first gate insulating layer 112 and a thickness t2 of the second gate insulating layer 113 may be about 1,000 Å to about 1,500 Å. A thickness t3a of the first interlayer insulating layer 115_1 and a thickness t3b of the second interlayer insulating layer 115_2 may be about 1,500 Å to about 3,500 Å. In this case, the first height ht1 of the first organic insulating layer 116 inside the opening H1 may be about 2 μm.

Figure 10A:
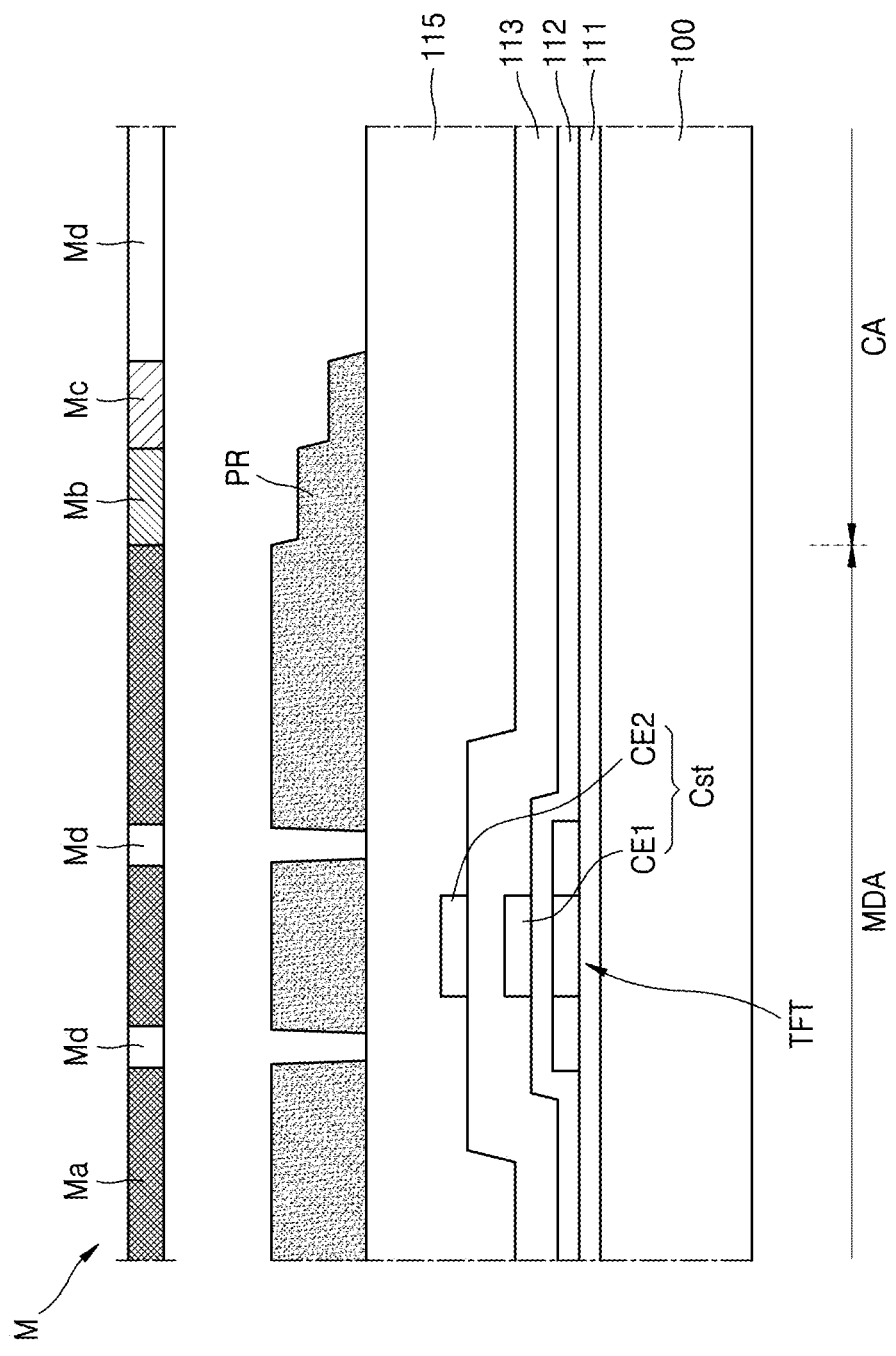
FIGS. 10A, 10B, 10C, and 10D are cross-sectional views sequentially illustrating a method of manufacturing a display panel according to an embodiment.
Figure 10B:
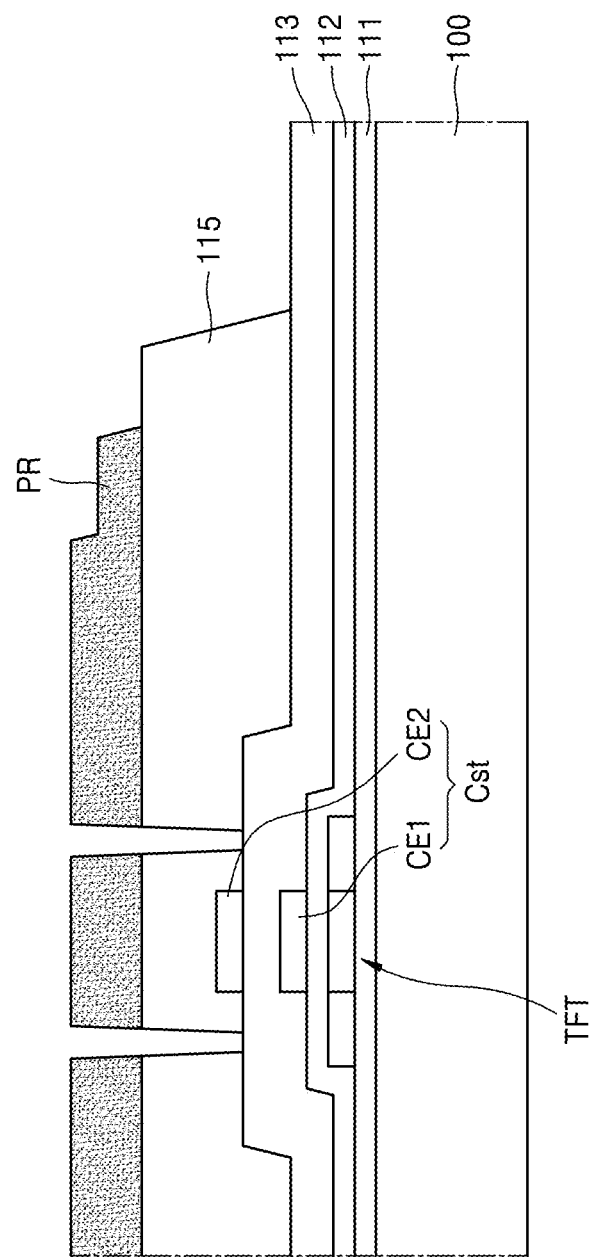
Figure 10C:
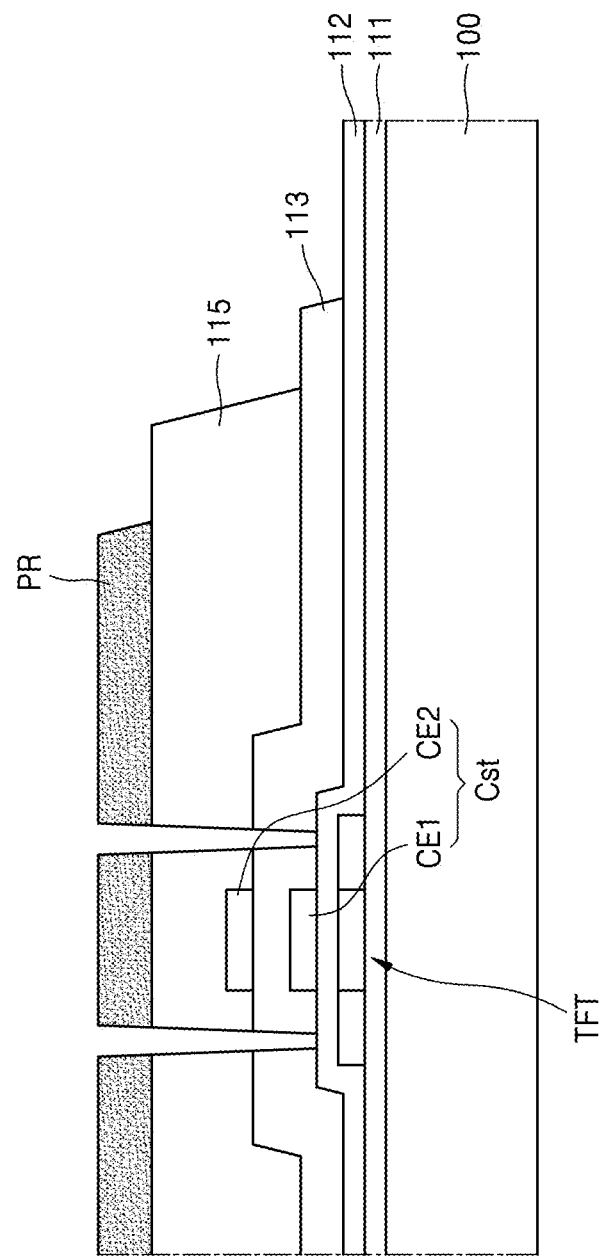

FIGS. 10A, 10B, and 10C are schematic cross-sectional views sequentially illustrating a method of forming an opening of an inorganic insulating layer, according to an embodiment.

Referring to FIG. 10A, a semiconductor layer of a main thin film transistor TFT, a first gate insulating layer 112, a gate electrode and/or a lower electrode CE1 of a storage capacitor Cst, a second gate insulating layer 113, an upper electrode CE2 of the storage capacitor Cst, and an interlayer insulating layer 115 may be formed over a substrate 100.

Thereafter, a photoresist (PR) pattern may be formed over the interlayer insulating layer 115. The PR pattern may be formed by using a mask M having different light transmittance for each area. For example, the mask M may be a slit mask and may include a first area Ma blocking all of irradiated light, a second area Mb and a third area Mc partially transmitting light, and a fourth area Md transmitting all of light. In this case, the light transmittance of the second area Mb may be less than the light transmittance of the third area Mc. Accordingly, the thickness of the PR pattern may be formed to be different for each area.

Referring to FIG. 10B, the interlayer insulating layer 115 may be primarily etched by using the PR pattern. In this case, a portion of the interlayer insulating layer 115 arranged in the component area CA may be etched, and a contact hole may be formed in the interlayer insulating layer 115 in the main display area MDA.

Thereafter, referring to FIG. 10C, while the thinnest portion of the PR pattern is etched, a portion of the interlayer insulating layer 115 and the second gate insulating layer 113 corresponding thereto may be etched. In this case, a contact hole may be formed in the second gate insulating layer 113 in the main display area MDA.

Figure 10D:
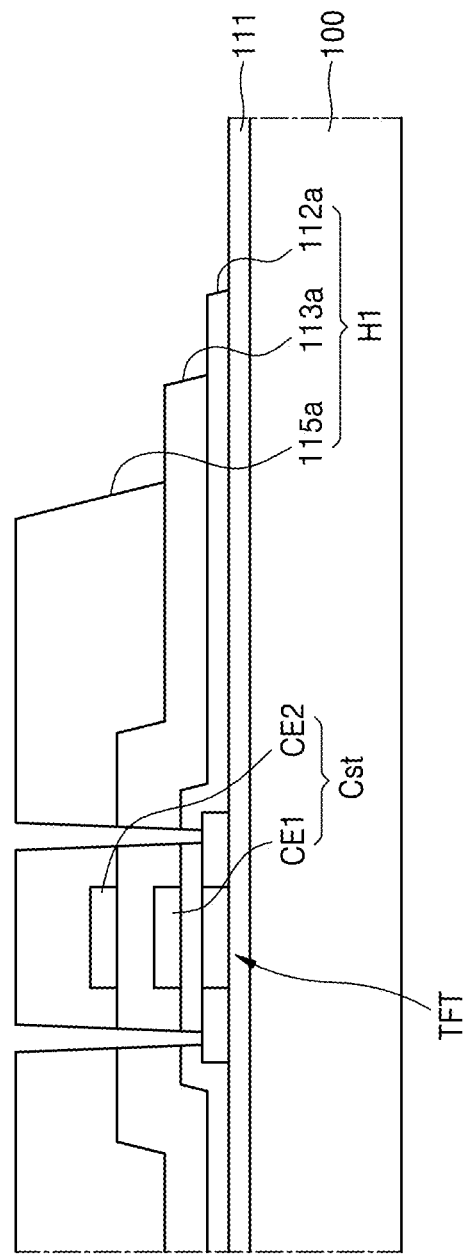

Thereafter, referring to FIG. 10D, while a thin portion of the remaining PR pattern is etched, a portion of the interlayer insulating layer 115, a portion of the second gate insulating layer 113, and the first gate insulating layer 112 corresponding thereto may be etched to respectively form a third opening 115a, a second opening 113a, and a first opening 112a. In this case, a contact hole may be formed in the first gate insulating layer 112 in the main display area MDA.

As such, by collectively etching the inorganic insulating layer IL by using one photoresist pattern, a stair-shaped step difference may be formed at the inner surface of the opening H1, thus reducing the process cost and shortening the process time.

However, embodiments are not limited thereto. The first opening 112a, the second opening 113a, and the third opening 115a may be formed in various ways such as being formed by using separate photoresist patterns.

Figure 11A:
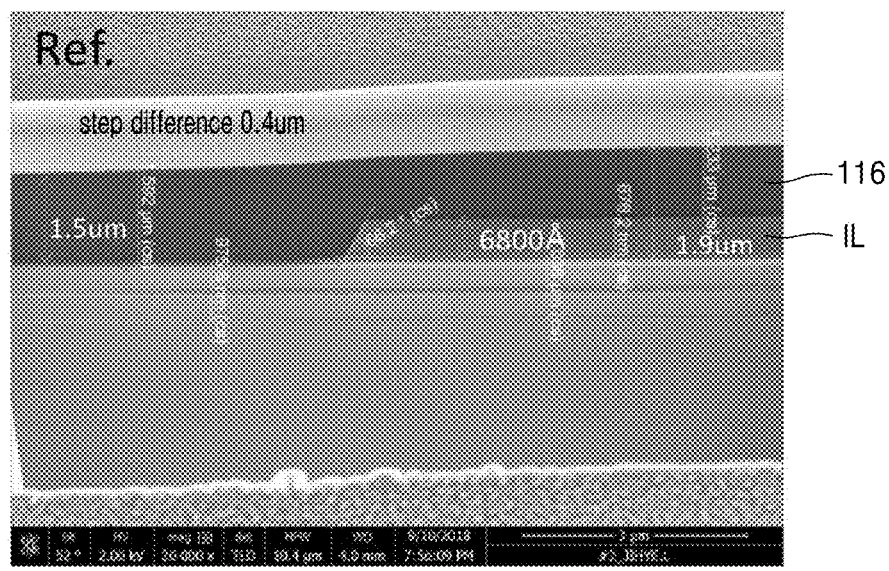
FIGS. 11A and 11B are test pictures illustrating the relationship between the thickness of an inorganic insulating layer and the flatness of a first organic insulating layer.
Figure 11B:
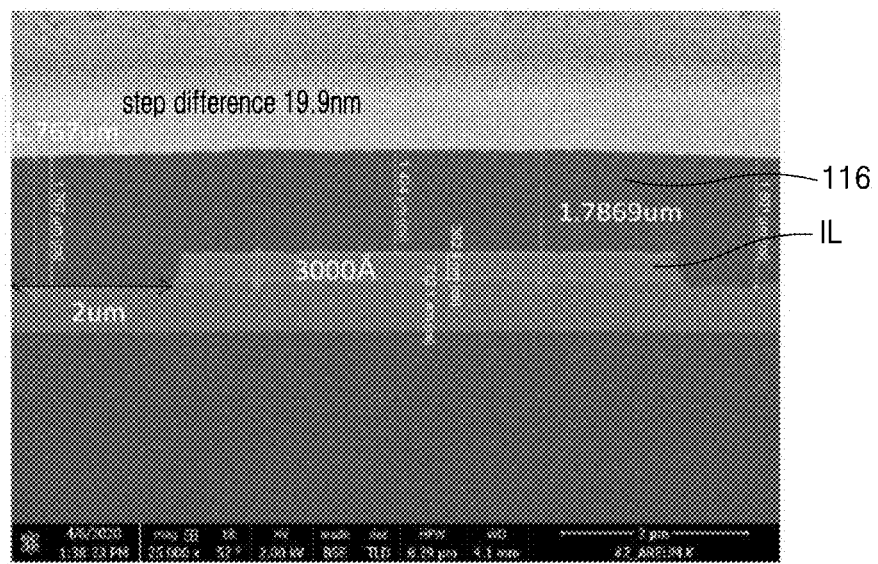

FIGS. 11A and 11B are test pictures illustrating the relationship between the thickness of an inorganic insulating layer and the flatness of a first organic insulating layer.

FIG. 11A illustrates a case in which the thickness of the inorganic insulating layer IL is formed to be 6,800 Å and the first organic insulating layer 116 is formed thereover. In this case, the height of the first organic insulating layer 116 was 1.9 μm at a portion where the inorganic insulating layer IL is arranged, and the height of the first organic insulating layer 116 at a point spaced apart by about 2 μm from the edge of the inorganic insulating layer IL was 1.5 μm. For example, the step difference of the upper surface of the first organic insulating layer 116 has a difference of 0.4 μm between the points with and without the inorganic insulating layer IL.

FIG. 11B illustrates a case in which the thickness of the inorganic insulating layer IL is formed to be 3,000 Å and the first organic insulating layer 116 is formed thereover. In this case, the height of the first organic insulating layer 116 was 1.7869 μm at a portion where the inorganic insulating layer IL is arranged, and the height of the first organic insulating layer 116 at a point spaced apart by about 2 μm from the edge of the inorganic insulating layer IL was 1.767 μm. For example, the step difference of the upper surface of the first organic insulating layer 116 has a difference of 19.9 nm between the points with and without the inorganic insulating layer IL.

This may mean that, when the inner surface of the opening of the inorganic insulating layer IL is formed in a stair shape with a thickness of about 3,000 Å or less and at intervals of about 2 μm or more, the height of the first organic insulating layer 116 arranged thereover is little different for each position. For example, the upper surface of the first organic insulating layer 116 may be provided to be flat.

As described above, in the display panel and the display apparatus according to an embodiments, because the pixel circuit is not arranged in the component area, a wider transmission area may be secured and thus the light transmittance thereof may be improved.

Also, in the display panel and the display apparatus according to an embodiments, because the inorganic insulating layer arranged in the component area includes an opening, the light transmittance thereof may be improved, and because the side surface of the opening is provided in a stair shape, the flatness of the first organic insulating layer may be improved, which may be advantageous in the process thereof.

However, the scope of the disclosure is not limited to these effects.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
a substrate comprising a main display area, a component area, and a peripheral area;
an inorganic insulating layer overlapping a surface of the substrate and comprising a terraced opening overlapping the component area;
a buffer layer disposed between the inorganic insulating layer and the substrate;
a first organic insulating layer filling the terraced opening in the inorganic insulating layer; and
an auxiliary light emitting display element overlapping both the first organic insulating layer and the component area, wherein
the inorganic insulating layer comprises a first insulating layer having a first opening, a second insulating layer having a second opening, and a third insulating layer having a third opening,
the first opening in the first insulating layer, the second opening in the second insulating layer, and the third opening in the third insulating layer overlap each other and form corresponding portions of the terraced opening in the inorganic insulating layer, an area of the first opening is less than an area of the second opening, and
the first insulating layer is positioned nearer to the substrate than the second insulating layer.

2. The display panel of claim 1, further comprising:
an auxiliary pixel circuit overlapping the peripheral area and comprising an auxiliary thin film transistor; and
a transparent connection line electrically connecting the auxiliary light emitting display element to the auxiliary pixel circuit and at least partially overlapping the first organic insulating layer in a region overlapping the component area.

3. The display panel of claim 2, further comprising:
a metal connection line electrically connecting the transparent connection line to the auxiliary light emitting display element, wherein
the metal connection line and the transparent connection line are disposed on a same layer as one another, and
a portion of the transparent connection line directly contacts a corresponding portion of the metal connection line.

4. The display panel of claim 1, wherein:
each of a first distance between an end of an inner surface of the first opening and an end of an inner surface of the second opening and a second distance between the end of the inner surface of the second opening and an end of an inner surface of the third opening is about 2 μm or more, and
a sum of the first distance and the second distance is in a range of about 4 μm to about 25 μm.

5. The display panel of claim 1, wherein
a sum of a thickness of the first insulating layer and a thickness of the second insulating layer is greater than 0 Å and less than or equal to about 3000 Å, and
a plane tangent to an inner surface of the first opening is also tangent to an inner surface of the second opening.

6. The display panel of claim 1, wherein
the third insulating layer comprises a stack of a first layer and a second layer formed of different materials from one another,
the first layer comprises a (3-1)-th opening,
the second layer comprises a (3-2)-th opening, and
an inner surface of the (3-1)-th opening and an inner surface of the (3-2)-th opening are misaligned with each other.

7. The display panel of claim 1, wherein the buffer layer is continuously disposed on the component area.

8. The display panel of claim 1, wherein the buffer layer includes a buffer-opening overlapping the component area.

9. A display panel comprising:
a substrate comprising a main display area, a component area, and a peripheral area;
an inorganic insulating layer overlapping the substrate and comprising an opening overlapping the component area;
a first organic insulating layer filling the opening in the inorganic insulating layer;
a main light emitting display element disposed on the main display area;
a main pixel circuit electrically connected to the main light emitting display element; and
an auxiliary light emitting display element overlapping both the first organic insulating layer and the component area, wherein
the inorganic insulating layer comprises a first insulating layer having a first opening, a second insulating layer having a second opening, and a third insulating layer having a third opening,
the first opening in the first insulating layer, the second opening in the second insulating layer, and the third opening in the third insulating layer overlap each other and form corresponding portions of the opening in the inorganic insulating layer,
an area of the first opening is less than an area of the third opening, and
the first organic insulating layer is disposed between the main light emitting display element and the main pixel circuit.

10. The display panel of claim 9, further comprising:
a second organic insulating layer overlapping the first organic insulating layer.

11. A display apparatus comprising:
a display panel comprising a main display area comprising main subpixels, a component area comprising auxiliary subpixels, and a peripheral area corresponding to a non-display area disposed outside of both the main display area and the component area; and
a component disposed under the display panel, the component area overlapping the component in a direction perpendicular to the component, wherein
the display panel comprises:
   a substrate;
   an inorganic insulating layer overlapping the substrate in the direction, the inorganic insulating layer comprising an opening disposed in the component area;
   a first organic insulating layer filling the opening in the inorganic insulating layer;
   an auxiliary light emitting display element disposed in the component area; and
   an auxiliary pixel circuit comprising an auxiliary thin film transistor disposed in the peripheral area and that drives the auxiliary light emitting display element to emit light, the auxiliary light emitting display element being spaced apart from the auxiliary thin film transistor in an orthographic view in the direction,
the inorganic insulating layer comprises a first insulating layer having a first opening, a second insulating layer having a second opening, and a third insulating layer having a third opening,
the first opening in the first insulating layer, the second opening in the second insulating layer, and the third opening in the third insulating layer overlap each other in the direction and form corresponding portions of the opening in the inorganic insulating layer, and
an area of the first opening is less than an area of the third opening.

12. The display apparatus of claim 11, wherein
the auxiliary pixel circuit is disposed in the peripheral area, and
the display apparatus further comprises a transparent connection line electrically connecting the auxiliary light emitting display element to the auxiliary pixel circuit, a portion of the transparent connection line overlapping, in the direction, a portion of the first organic insulating layer in the component area.

13. The display apparatus of claim 12, further comprising:
a metal connection line electrically connecting the transparent connection line to the auxiliary light emitting display element, wherein
the metal connection line and the transparent connection line are disposed on a same layer as one another, and
the portion of the transparent connection line directly contacts a corresponding portion of the metal connection line.

14. The display apparatus of claim 11, wherein
each of a first distance between an end of an inner surface of the first opening and an end of an inner surface of the second opening and a second distance between the end of the inner surface of the second opening and an end of an inner surface of the third opening is about 2 μm or more, and
a sum of the first distance and the second distance is in a range of about 4 μm to about 25 μm.

15. The display apparatus of claim 11, wherein
a sum of a thickness of the first insulating layer in the direction and a thickness of the second insulating layer in the direction is greater than 0 Å and less than or equal to about 3000 Å, and
a plane tangent to an inner surface of the first opening is also tangent to an inner surface of the second opening.

16. The display apparatus of claim 11, wherein
the third insulating layer comprises a stack of a first layer and a second layer formed of different materials from one another,
the first layer comprises a (3-1)-th opening,
the second layer comprises a (3-2)-th opening, and
an inner surface of the (3-1)-th opening and an inner surface of the (3-2)-th opening are misaligned with each other.

17. The display apparatus of claim 11, further comprising:
a buffer layer disposed between the substrate and the inorganic insulating layer,
wherein the buffer layer is continuously disposed in the component area.

18. The display apparatus of claim 11, further comprising:
a buffer layer disposed between the substrate and the inorganic insulating layer,
wherein the buffer layer includes a buffer-opening in the component area.

19. The display apparatus of claim 11, further comprising:
a main light emitting display element disposed in the main display area; and
a main pixel circuit electrically connected to the main light emitting display element,
wherein the first organic insulating layer is disposed between the main light emitting display element and the main pixel circuit.

20. The display apparatus of claim 11, wherein
the component comprises an imaging device, and
the auxiliary light emitting display element overlaps the imaging device in the direction.

* * * * *